(12) United States Patent
Nonnenmann et al.

(10) Patent No.: US 10,903,075 B2
(45) Date of Patent: Jan. 26, 2021

(54) ORDERED NANOSCALE ELECTRIC FIELD CONCENTRATORS FOR EMBEDDED THIN FILM DEVICES

(71) Applicant: University of Massachusetts, Boston, MA (US)

(72) Inventors: Stephen Sommers Nonnenmann, Amherst, MA (US); Jiaying Wang, Cupertino, CA (US)

(73) Assignee: University of Massachusetts, Boston, MA (US)

( * ) Notice: Subject to any disclaimer, the term of this patent is extended or adjusted under 35 U.S.C. 154(b) by 0 days.

(21) Appl. No.: 16/575,195

(22) Filed: Sep. 18, 2019

(65) Prior Publication Data

US 2020/0090932 A1    Mar. 19, 2020

Related U.S. Application Data

(60) Provisional application No. 62/732,851, filed on Sep. 18, 2018.

(51) Int. Cl.

| | |
|---|---|
| *H01L 21/02* | (2006.01) |
| *B82Y 10/00* | (2011.01) |
| *B82Y 40/00* | (2011.01) |
| *B82Y 30/00* | (2011.01) |

(52) U.S. Cl.
CPC .... *H01L 21/02554* (2013.01); *H01L 21/0259* (2013.01); *H01L 21/02164* (2013.01); *H01L 21/02178* (2013.01); *H01L 21/02181* (2013.01); *B82Y 10/00* (2013.01); *B82Y 30/00* (2013.01); *B82Y 40/00* (2013.01)

(58) Field of Classification Search
CPC ......... H01L 21/02554; H01L 21/02178; H01L 45/1608; H01L 45/1233; H01L 45/146; B82Y 30/00; B82Y 40/00; B82Y 10/00
See application file for complete search history.

(56) References Cited

U.S. PATENT DOCUMENTS

| | | | |
|---|---|---|---|
| 8,385,046 B2 * | 2/2013 | Palusinski | H01G 4/06 361/303 |
| 9,343,523 B2 * | 5/2016 | Phatak | H01L 21/02181 |
| 9,831,424 B2 * | 11/2017 | Tour | H01L 27/2472 |
| 2004/0149979 A1 * | 8/2004 | Cheong | H01L 51/0048 257/9 |
| 2016/0362807 A1 * | 12/2016 | Casse | C25D 11/18 |

\* cited by examiner

*Primary Examiner* — William Coleman

(74) *Attorney, Agent, or Firm* — Schwegman Lundberg & Woessner, P.A.

(57) ABSTRACT

A method comprises depositing forming a first oxide layer comprising a bottom surface in contact with a first electrode, positioning a template at a specified position on a top surface of the first oxide, the template comprising a plurality of nanopores that extend through the template, depositing a metal material into at least a portion of the plurality of nanopores, allowing the metal material to at least partially solidify in at least the portion of the plurality of nanopores to form nanostructures in contact with the first oxide top surface, separating the template from the first oxide layer and the nanostructures, forming a second oxide layer comprising a bottom surface in contact with the first oxide top surface and the nanostructures, and forming a second electrode in electrical contact with at least a portion of a top surface of second oxide top surface.

18 Claims, 28 Drawing Sheets

ORDERED NANOSCALE ELECTRIC FIELD CONCENTRATORS FOR EMBEDDED THIN FILM DEVICES

CROSS-REFERENCE TO RELATED APPLICATION

This application claims the benefit of priority to U.S. Provisional Patent Application Ser. No. 62/732,851, entitled "ORDERED NANOSCALE ELECTRIC FIELD CONCENTRATORS FOR EMBEDDED THIN FILM DEVICES," filed on Sep. 18, 2018, the disclosure of which is incorporated herein in its entirety by reference.

BACKGROUND

Many energy and electronic devices follow a simple two terminal scheme comprising one or more insulating layers sandwiched between two metal electrodes. The one or more insulating layers often comprise a metal oxide and are typically the functional structure of the device. Some memory applications, such as memristors or resistive switches, manipulate defects in the one or more oxide layers to function. Often these defects form in filaments, but are randomized and hard to control.

SUMMARY

The present disclosure describes a process for forming highly ordered nanoscale metal structures that are to be embedded in a metal oxide functional structure of an electronic device, such as a memristor or a resistive switch. The nanoscale structures can act as an electric field concentrator during the operation of the electronic device.

In an example, described herein, a process includes forming a bottom electrode, forming a first oxide layer on the bottom electrode, positioning an anodic aluminum oxide (AAO) template on the first oxide layer, forming metal nanoscale structures using the AAO template, forming a second oxide layer over the nanoscale structures and the first oxide layer, and forming a top electrode on the second oxide layer.

The present inventors have recognized, among other things, that a problem to be solved can include difficulties in reliably controlling one or more of positioning, size distribution, and operation of embedded metal nanostructures to be used as electronic field concentrators. The present subject matter described herein can provide a solution to this problem, such as by providing a process that uses an anodic aluminum oxide template to form highly-ordered nanostructure arrays. The process described herein can provide for more reliable control over placement and size of the nanostructures being formed and can provide for large-scale fabrication of the resulting electronic devices better than existing methods of embedding nanostructures in metal oxide films for electronic devices.

This summary is intended to provide an overview of subject matter of the present disclosure. It is not intended to provide an exclusive or exhaustive explanation of the invention. The detailed description is included to provide further information about the present disclosure.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
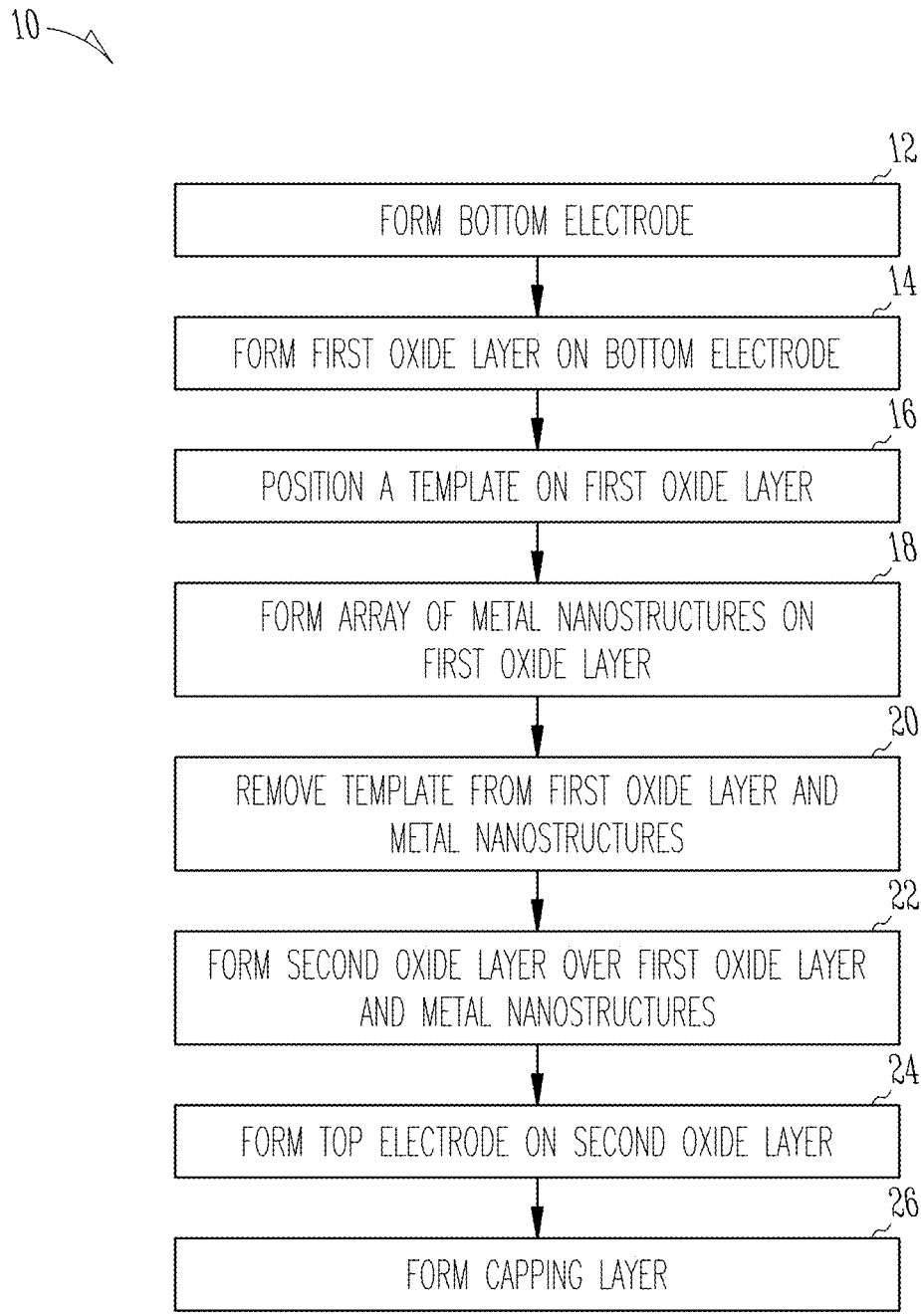
FIG. 1A is a flow diagram of a process for fabricating an electronic device with an array of nanostructures embedded within a metal oxide structure.

The following detailed description includes references to the accompanying drawings, which form a part of the detailed description. The drawings show, by way of illustration, specific embodiments in which the invention may be practiced. These embodiments, which are also referred to herein as "examples," are described in enough detail to enable those skilled in the art to practice the invention. The example embodiments may be combined, other embodiments may be utilized, or structural, and logical changes may be made without departing from the scope of the present invention. While the disclosed subject matter will be described in conjunction with the enumerated claims, it will be understood that the exemplified subject matter is not intended to limit the claims to the disclosed subject matter. The following detailed description is, therefore, not to be taken in a limiting sense, and the scope of the present invention is defined by the appended claims and their equivalents.

References in the specification to "one embodiment", "an embodiment," "an example embodiment," "an example," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt. % to about 5 wt. %, but also the individual concentrations (e.g., 1%, 2%, 3%, and 4%) and the sub-ranges (e.g., 0.1% to 0.5%, 1.1% to 2.2%, and 3.3% to 4.4%) within the indicated range.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the steps can be carried out in any order without departing from the principles of the invention, except when a temporal or operational sequence is explicitly recited. Recitation in a claim to the effect that first a step is performed, and then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

As noted above, many examples of electronic devices include one or more metal oxide insulating layers sandwiched between two metal electrodes. As is also noted above, some devices, such as memristors or resistive switches, can function by manipulating defects in the one or more metal oxide layers. For example, structures that can act to concentrate an electric field, such as filaments or other small structures, can be embedded in or on a metal oxide layer to take advantage of defects in the metal oxide layer. However, it can be difficult to control placement or operation of such filaments. For example, attempts have been made to embed clusters of small, nanoscale-sized metal structures inside the one or more metal oxide layers to concentrate the electric field and localize the filament. However, these attempts have tended to produce nanostructures with a wide size distributions and in clusters with seemingly no controllable spatial arrangement.

The present disclosure describes a process that uses an ordered template to form nanoscale-sized metal structures in or on a metal oxide structure that will form a part of an electronic device, such as a memristor device. As used herein, the terms "nanoscale" and "nanostructure," as well as similar terms such as "nanoisland," refer to structures with a largest size in any one particular direction is no more than about 1 micrometer (μm) such that the size of the structure is most easily described using nanometers (nm). In some preferred examples, the terms "nanoscale," "nanostructure," and "nanoisland" refer to structures with a largest dimensional size being less than about 500 nm, such as less than about 250 nm, for example less than about 100 nm.

The process described herein allows the nanostructures to be formed in one or more clusters in a predefined pattern of known area density and spacing, such as in a hexagonal pattern. The process described herein, therefore, eliminates or minimizes what has heretofore been seemingly randomized formation of such nanostructures. The process described herein has resulted in dramatic and surprising improvements compared to previously-known methods of producing nanoscale electric field concentrators in these types of electronic devices. For example, the process described herein has been found to result in improvements in operating parameters such as on/off voltage.

As described in more detail below, an example device of a memristor is described herein to demonstrate the process of depositing metal nanoclusters in the predefined pattern.

The present disclosure describes a $HfO_2$-based memristor with one or more arrays of highly-ordered metal nanostructures embedded in an oxide film matrix, such as nanostructures comprising platinum metal ($Pt^0$) or titanium metal ($Ti^0$). The resulting embedded film was found to exhibit significant reduction in both the set voltage and the reset voltage. In some examples, the resulting embedded film displays enhanced uniformity of operating voltages and resistance states compared to earlier known methods and the devices that result from them. The inventors demonstrate that this behavior is attributable, at least in part, to the concentration of electric field surrounding the metal nanostructures when they are inserted into the oxide film matrix. Furthermore, the inventors show that interactions between the metal nanostructures and the local oxide environment display separate filamentary formation mechanisms that affect the stability.

The process of forming the metal nanostructures described below has been found to improve, and in at least some examples optimize, uniformity by translating the position of the nanostructure down the thickness dimension of the metal oxide film toward the bottom electrode. A comparison of density and distribution of oxygen vacancies responsible for the formation/dissolution of conducting filaments was made via combined electrostatic force microscopy (EFM) and conductive atomic force microscopy (c-AFM) studies. Observation of the morphological evolution of conducting filaments produced by the metal nanostructures was enabled using a three-dimensional (3-D) c-AFM nanotomography technique to provide direct correlations to the overall switching performance.

Memristor Devices

In an example, a memristor comprises a two terminal metal-oxide-metal (hereinafter "M-O-M") sandwich structure that exhibits a resistance state dependent upon the history of the applied external bias. It is widely-accepted that a memristor structure such as this demonstrates enormous promise as a next-generation memory storage elements due to its simple and highly-scalable structure, low power consumption, fast response time, and multi-state logic potential. In an example, the memristor device operates under a filamentary or interfacial switching mechanism governed by the local redistribution of defects, such as oxygen vacancy concentrations in oxides under high electric fields, e.g., fields greater than about 10 kilovolts per meter (kV/m).

One class of memristor, so-called valence change memory (hereinafter "VCM") devices, comprise a metal-oxide sandwiched between electrodes of differing work functions. VCM devices are able to leverage subsequent defect dynamics during operation, when oxygen vacancies accumulate and form conductive filaments (hereinafter "CFs"). In some examples, each CF provides a highly-conductive pathway to define a low-resistance state (hereinafter "LRS") while sufficient voltage of the opposite polarity disrupts the CF and results in a high-resistance state (hereinafter "HRS"). A challenge associated with CF-based approaches is that the switching process does not typically form a single columnar unit bridging the top and bottom electrodes within the oxide film, but rather tends to form multiple local and competitive pathways during CF formation. Even small geometric variations can induce intense fluctuations in operating voltages, HRS/LRS resistance states, and reset current that can further cause retention and endurance problems. The set voltage (also referred to as "$V_{SET}$") often experiences higher variability than the reset voltage (also referred to as "$V_{RESET}$"), which tends to strongly depend on the geometry of the disrupted filament, e.g., the shape and/or the length of the filament. Severe cycle-to-cycle instability of switching performance within the oxide layer has continued to be one of the critical challenges hindering widespread adoption of memristive elements in next generation memory and neuromorphic computing applications.

In an example, a memristor of the present disclosure includes metallic nanostructures embedded within the oxide film of the memristor. The embedded nanostructures improve parameter fluctuation of the memristor, such as by providing for at least one of the following in the memristor: multilevel switching, enhanced retention, higher on/off ratios, and lower operating voltages. Each of the improved operational properties of the memristor can be attributed, at least in part, to enhanced local electric fields and higher vacancy concentrations provided by the embedded nanostructures. Nanostructures, however, have been difficult to effectively and reliably embed in an oxide layer and resulting devices have been known to suffer from random spatial distributions, unpredictable density, and variable sizes of metallic nanoclusters in the oxide layer. The reason for these undesirable results are because nanostructures have typically been fabricated either by ion bombardment or an annealing and dewetting process. Recrystallization is highly dependent on temperature and environment. In addition, cluster size has been shown to depend on metal electronegativity. As such, the size and distribution of embedded metal nanostructures formed by these methods has not been systematically varied or controllable.

The materials used to form embedded nanostructure has thus far been limited to metals, such as silver ($Ag^0$), gold ($Au^0$), cobalt ($Co^0$), nickel ($Ni^0$), palladium ($Pd^0$), platinum ($Pt^0$), ruthenium ($Ru^0$), titanium ($Ti^0$), or hafnium ($Hf^0$). The inclusion of these metals to modulate the barrier height and help dictate the conduction mechanism has led to the study the ionic interactions between the nanocrystals of the metal and the surrounding oxide film in which they are embedded. Though the embedded metals are known to locally concentrate the electric field, additional correlations between the metal and the oxide matrix, such as the effects of oxygen affinity and mobility, have remained unclear.

The inventors have discovered a process that provides for hierarchically ordered embedded metallic nanostructure arrays as local electric field concentrators to mediate stochastic filament formation in metal oxide films, such as a hafnium oxide ($HfO_2$, also referred to as "hafnia") film. The highly-ordered metal nanostructures formed by the process of the present invention have been found to enhance the memristive character of the device that uses the nanostructure embedded metal oxide film. As described in more detail below, in an example, the process comprises a simple, versatile, template-assisted fabrication scheme to embed ordered metallic arrays in a metal oxide film, such as the archetype switching oxide hafnia ($HfO_2$) of the examples described herein. This fabrication process reduces, and in some examples eliminates or minimizes, random spatial distribution that has resulted from previously-known approaches to mitigate device-to-device variability. Thin films embedded with ordered arrays of embedded metals, such as platinum (Pt), titanium (Ti), and silver (Ag) nanostructures (sometimes also referred to herein as "nanoislands" or "NIs"), exhibit substantially reduced operating voltages and improvements in overall uniformity of the LRS and HRS. The metal nanostructure embedded films of the present disclosure have been shown to exhibit at least one of, and in some cases more than one of: improved electric field concentration, improved filament formation, and improved oxygen scavenging effects, as revealed by statistical analysis and electrostatic force microscopy (EFM). Distinct conductive filament morphology and formation mechanisms were also identified for at least some examples of the metal nanostructure embedded oxide films described herein, e.g., a subfilamentary network for a platinum-embedded $HfO_2$ film and branched filaments for a titanium-embedded $HfO_2$ film, as demonstrated using a diamond-coated conductive atomic force microscopy (c-AFM) tip as a "scalpel" in performing 3-D c-AFM nanotomography.

Fabrication Process

Figure 2A:
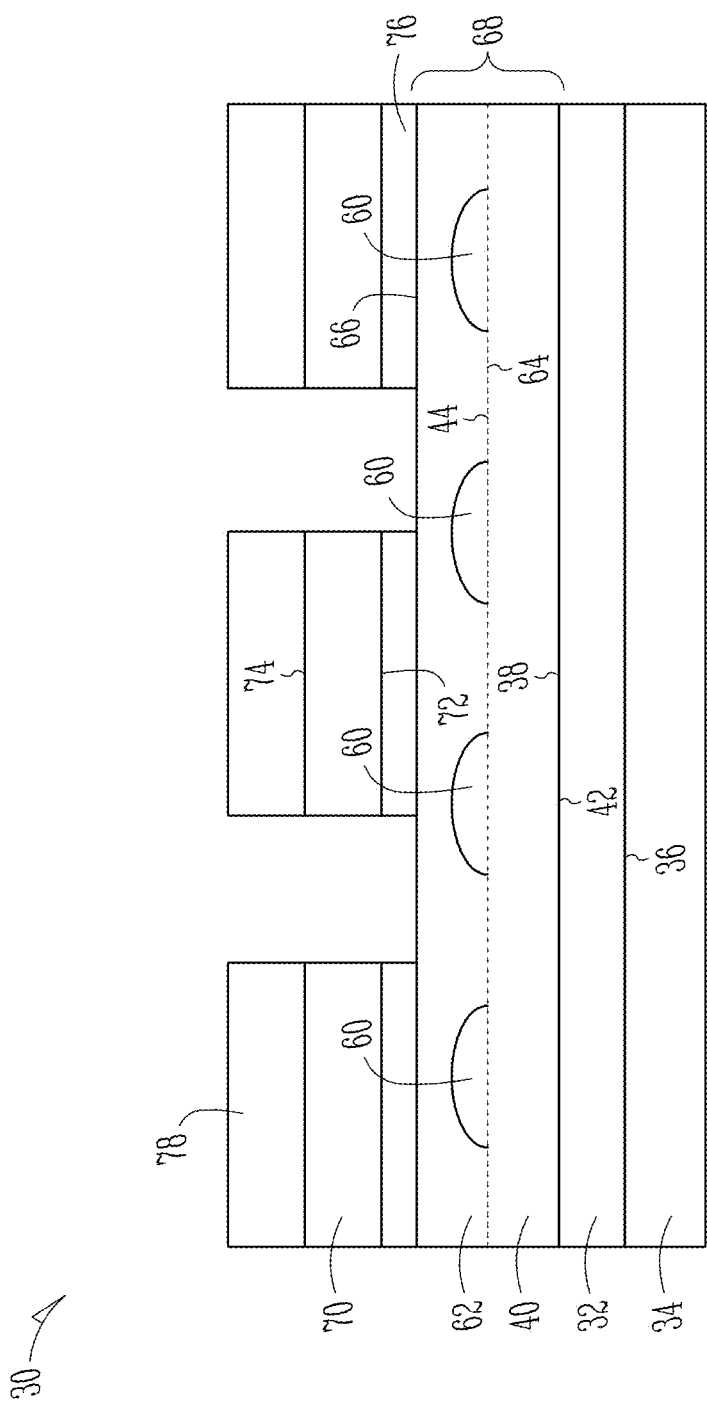
FIG. 2A is a cross-sectional side view of a device structure of an electronic device made according to the process of FIG. 1A.

The process of the present disclosure uses template-directed fabrication with ultrathin anodic aluminum oxide. The inventors have found that such template-directed fabrication yields highly-ordered nanostructure arrays, representing an effective, low-cost alternative to complicated and costly lithographic processes. The anodic aluminum oxide provides for additional advantages such as large scale fabrication, and tunablility of the nanopore size, thickness and interpore spacing, motivating its use in recent studies of nanoscale memristors. FIG. 1A is a flow diagram of an example templated-directed process 10 for embedding an ordered array of metal nanoislands within the oxide layer of a M-O-M structures. FIG. 2A shows a cross-sectional view of the resulting device 30 that results from the example process 10 shown in FIG. 1A. In an example, the process begins by forming a first electrode 32 (Step 12), for example by depositing a material of the first electrode 32 onto a substrate 34. The formed first electrode 32 has a first surface 36 that is in contact with the substrate 34 and a second surface 38 that opposes or generally opposes the first surface 36. In an example, the first surface 36 and the second surface 38 are planar or substantially planar and are parallel or substantially parallel to one another.

In the example shown in FIG. 2A, the first surface 36 is on a bottom side of the first electrode 32 and the second surface is on a top side of the first electrode 32 such that the substrate 34 and the first electrode 32 are on a bottom side of the device 30. For this reason, the first electrode 32 will also be referred to as "the bottom electrode 32," the first surface 36 will also be referred to as the "bottom surface 36," and the second surface 38 will also be referred to as the "top surface 38." However, those having skill in the art will recognize that the use of "top" and "bottom" with respect to these or any other structures are simply for ease of description and brevity, and that the they will not be limiting to the orientation of the structures before, during, or after the completion of any process described herein. In an example, the bottom electrode 32 is deposited by evaporation.

Next, a first oxide layer 40 is formed on the bottom electrode 32 (Step 14). In an example, the first oxide layer 40 is deposited by atomic layer deposition (ALD) of a first oxide material or materials onto the bottom electrode 32. In an example, the depositing of the first oxide material results in the first oxide layer 40 having a first oxide surface 42 that is in contact with the second surface 38 of the bottom electrode 32, and a second oxide surface 44 that opposes or substantially opposes the first oxide surface 42. In an example, the first oxide surface 42 and the second oxide surface 44 are planar or substantially planar and are parallel or substantially parallel to one another. In the example shown in FIG. 2A, the first and second oxide surfaces 42 and 44 are on a bottom side and a top side of the first oxide layer 40, respectively, and therefore will also be referred to herein as the "bottom oxide surface 42" and the "top oxide surface 44" for brevity and ease of description.

Figure 3:
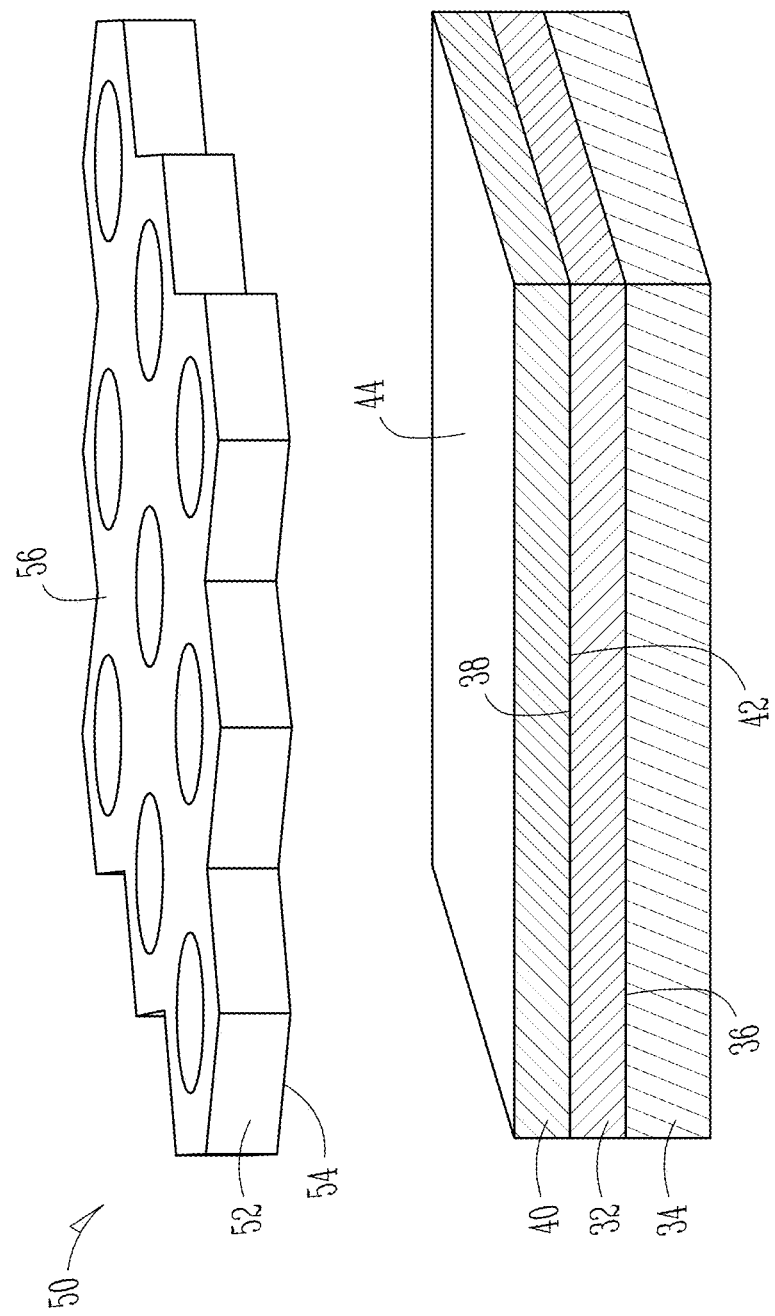
FIG. 3 is a perspective view of an example anodic aluminum oxide template as it is being positioned onto an oxide layer during the example process of FIG. 1A or the example process of FIG. 1B.

After forming the first oxide layer 40, the process can include positioning a template on the first oxide layer 40 (Step 16). FIG. 3 shows an example of the process 10 at step 16 with an example template 50 being in the process of being positioned on the first oxide layer 40. As can be seen in FIG. 3, the template 50 includes a template body 52 with a first template face 54 on one side of the template body 52 and an opposing second template face 56 on an opposing side of the template body 52. In an example, the first template face 54 and the second template face 56 are planar or substantially planar and are parallel or substantially parallel to one another. In an example, shown in FIG. 3, the first template face 54 is oriented so that it is on the bottom of the template body 52 so that the first template face 54 will contact the top oxide surface 44, while the opposing second template face 56 is on a top side of the template body 52, such that the first template face 54 will also be referred to as the "bottom template face 54" and the second template face 56 will also be referred to as the "top template face 56."

As can also be seen in FIG. 3, the template body 52 also defines a plurality of pores 58 that extend from the bottom template face 54 to the top template face 56. Each of the plurality of pores 58 can act as a mold cavity to form a corresponding structure onto the first oxide layer 40. In an example, the template 50 is an ultrathin template, e.g., with the template body 52 has an aspect ratio of 8 or less, such as 7 or less, 6 or less, 5 or less, 4 or less, 3 or less, 2 or less, or 1:1 or less (where the aspect ratio is defined as the thickness of the template relative to the diameter of the pores). In an example, the template body 52 has a thickness of _ nanometers (nm) or less, for example, _ nm or less, such as _ nm or less. In an example, each of the pores 58 has a largest width in a lateral direction (e.g., a diameter if the pore 58 is circular or ovular) of 1 micrometer (μm) or less, for example, 500 nm or less, such as 250 nm or less, for example 150 nm or less, such as 100 nm or less, for example 90 nm or less. For this reason, the pores 58 may also be referred to herein as "nanopores 58." In an example, the template is pre-formed.

In an example, the template body 52 is formed from an anodic aluminum oxide (AAO). For the sake of brevity, hereinafter the template 50 will be referred to as "the AAO template 52," however those of skill in the art will be able to contemplate other materials that can be used to form the plurality of metal nanostructures. Further details on some aspects of AAO templates that can be used for the process of the present disclosure for fabricating a device 10 with nanoscale structures and methods of fabricating such AAO templates can be found in U.S. Patent Publication No. 2006/0270229 A1, published on Nov. 30, 2006 and entitled "ANODIZED ALUMINUM OXIDE NANOPOROUS TEMPLATE AND ASSOCIATED METHOD OF FABRICATION", and in U.S. Patent Publication No. 2010/0298135 A1, published on Nov. 25, 2010 and entitled "POROUS ALUMINUM OXIDE TEMPLATES," the entire disclosures of which are incorporated herein by reference.

Next, an array comprising a plurality of metal structures 60 are formed on the first oxide layer 40 (Step 18). In an example, the mold cavities defined by the pores 58 of the AAO template 50 define the locations where the metal structures 60 are to be formed. In examples where the pores 58 are nanopores 58 (e.g., have a largest width in a lateral direction of 1 μm or less), than the resulting metal structures 60 will also have a largest width in the lateral direction of 1 μm or less (or 500 nm or less if the nanopores 58 are sized 500 nm or less, and so on with nanopores 58 of 250 nm or less, 150 nm or less, 100 nm or less, or 90 nm or less, as described above). Therefore, for the sake of brevity, the metal structures 60 will also be referred to as "nanostructures 60" or, in some examples, as "nanoislands 60." In an example, the metal nanoislands 60 are formed by evaporation, which causes the metal material to form in one or more of the mold cavities formed by the nanopores 58 in the AAO template body 52. In some examples, the material used to form the nanoislands 60 comprises at least one of the following transition metals: silver ($Ag^0$), gold ($Au^0$), cobalt (Co), nickel ($Ni^0$), palladium ($Pd^0$), platinum ($Pt^0$), ruthenium ($Ru^0$), titanium ($Ti^0$), or hafnium ($Hf^0$). In some examples, the nanoislands 60 are formed with a largest size in a lateral direction (e.g., a diameter for nanoislands that are circular or generally circular in cross section) of from about 10 nm to about 150 nm, such as from about 20 nm to about 100 nm, such as from about 30 nm to about 90 nm.

After the nanostructures 60 are formed and sufficiently solidified, the AAO template 50 can be removed and separated from the first oxide layer 40 and the nanoislands 60 (Step 20). Next, a second oxide layer 62 is formed over the top of the nanoislands 60 and the first oxide layer 40 (Step 22) by depositing a second oxide material or materials onto the first oxide layer 40 and the nanoislands 60. In an example, the second oxide layer 62 is formed by ALD, similar to the formation of the first oxide layer 36 described with respect to Step 16.

In an example, the depositing of the second oxide material results in the second oxide layer 62 having a first oxide surface 64 that is in contact with the second oxide surface 44 of the first oxide layer 36 and with at least a portion of the nanoislands 60, and a second oxide surface 66 that opposes or substantially opposes the first oxide surface 64. In an example, the first oxide surface 64 and the second oxide surface 66 are planar or substantially planar (except for the portions of the first oxide surface 64 that are in contact with the nanoislands 60) and are parallel or substantially parallel to one another. In the example shown in FIG. 2A, the first and second oxide surfaces 64 and 66 are on a bottom side and a top side of the second oxide layer 62, respectively, and therefore will also be referred to herein as the "bottom oxide surface 64" and the "top oxide surface 66" for brevity and ease of description.

The formation of the second oxide layer 62 over the top of the nanoislands 60 causes the nanoislands 60 to be sandwiched between the first oxide layer 40 and the second oxide layer 62. When the first and second oxide layers 40 and 62 are formed from the same oxide material, this sandwiching of the nanoislands 60 results in the nanoislands 60 being embedded within what is, practically speaking, a single, monolithic or substantially monolithic oxide structure 68.

In an example, the process 10 includes forming a second electrode 70 (Step 24), for example by depositing a material of the second electrode 70 onto the second oxide layer 62. The formed second electrode 70 has a first electrode surface 72 that is in electrical contact with the second surface 66 of the second oxide layer 62 and a second electrode surface 74 that opposes or generally opposes the first electrode surface 72. In an example, the first electrode surface 72 and the second electrode surface 74 are planar or substantially planar and are parallel or substantially parallel to one another. In the example shown in FIG. 2A, the first and second electrode surfaces 72 and 74 are on a bottom side and a top side of the second electrode 70, respectively, and therefore will also be referred to herein as the "bottom electrode surface 72" and the "top electrode surface 74" for brevity and ease of description. Similarly, as shown in the example of FIG. 2A, the second electrode 70 is located on a top side of the device 30, e.g., opposite the bottom electrode 32, such that the second electrode 70 will also be referred to herein as the "top electrode 70."

In an example, the top electrode 70 can be patterned, e.g., the top electrode 70 can be formed by any feasible patterned deposition method. In an example, the top electrode is coupled to the top oxide surface 66 with an adhesive 76. In an example, the process 10 can optionally include forming one or more capping layers 78 on the top electrode surface 74 of the top electrode 70 (Step 26 in FIG. 1A). In examples where the top electrode 70 is patterned, as in FIG. 2A, then the capping layer 78 can also be patterned as shown in FIG. 2A.

Figure 1B:
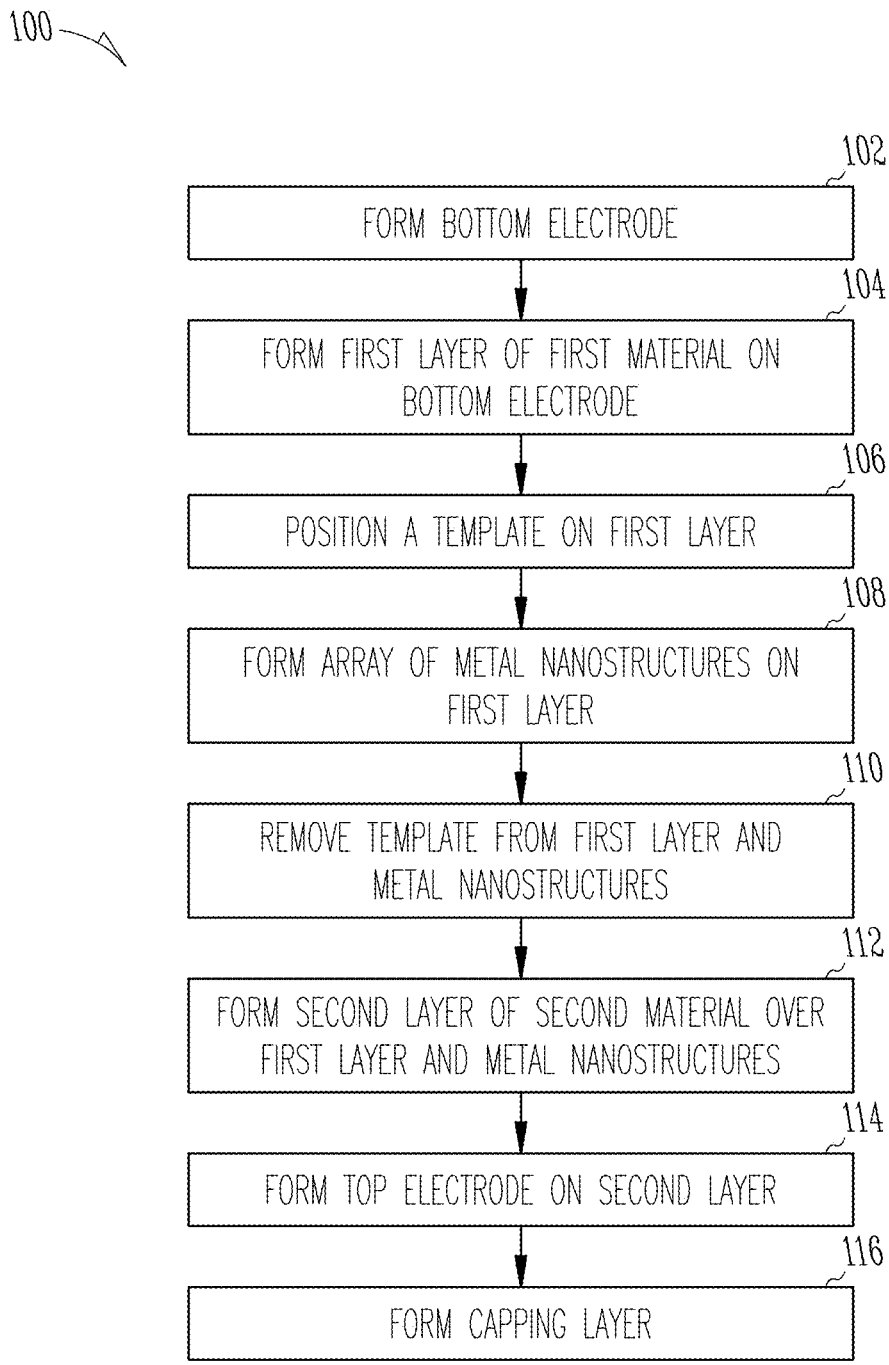
FIG. 1B is a flow diagram of a second example process for fabricating an electronic device with an array of nanostructures embedded within a metal oxide structure.
Figure 2B:
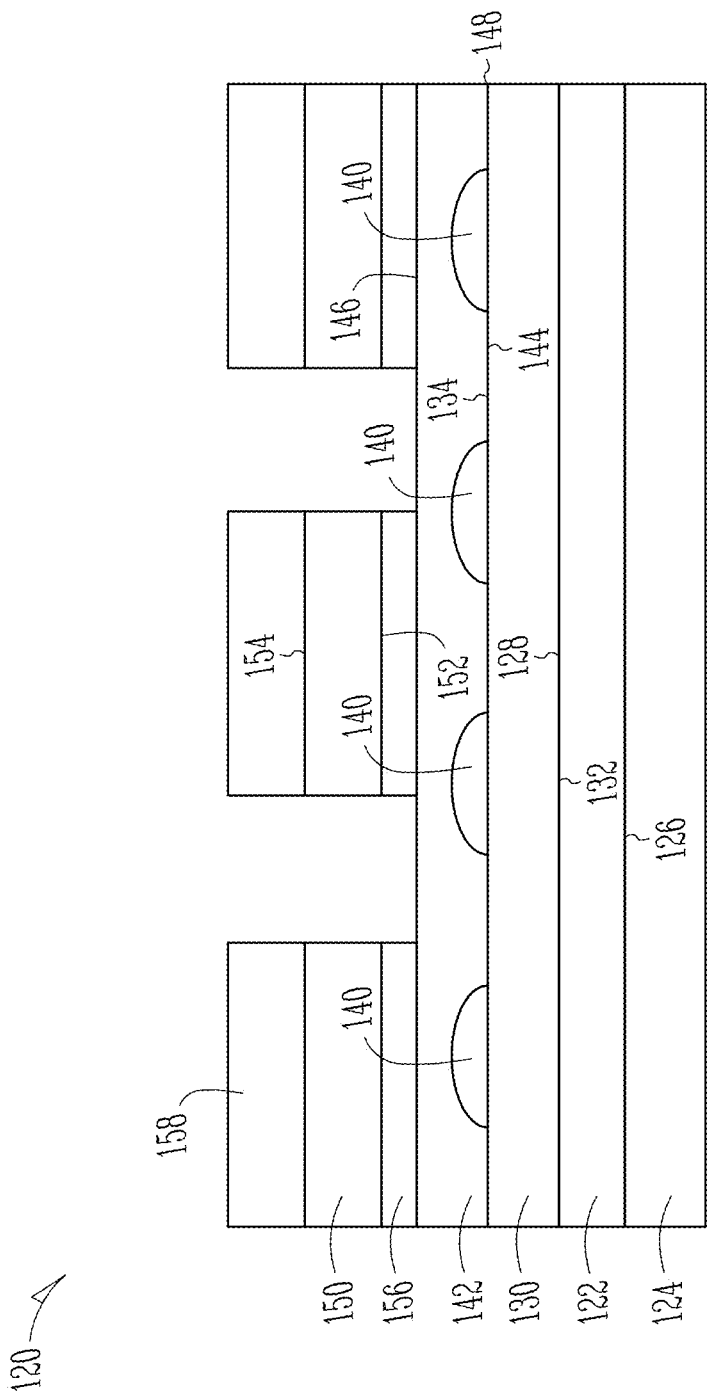
FIG. 2B is a cross-sectional side view of a first device structure of an electronic device made according to the second example process of FIG. 1B.

Variations to the process 10 shown and described above with respect to FIG. 1A are contemplated. For example, rather than embedding the nanostructures in an oxide structure that is essentially a single monolithic or substantially monolithic structure made from the same oxide material, a similar process can form a device with nanostructures embedded at an intersection between two layers made from different materials. FIG. 1B is a flow diagram of an example templated-directed process 100 for embedding an ordered array of metal nanoislands within an oxide structure comprising two layers made from two different materials. As used herein, "different materials" can refer to two different compounds (e.g., a first material for the first layer, such as an oxide, e.g., hafnia ($HfO_2$), and a second material for the second layer, such as a different oxide, e.g., silica ($SiO_2$), or a different type of material, such as a metal, nitride, carbide, or semiconductor material) or can refer to layers of the same material where each layer comprises a different composition of dopants or other additives (e.g., a first layer of $HfO_2$ with a first type of dopant and a second layer of $HfO_2$ with a second type of dopant) such that each layer acts differently when an electrical potential is applied thereto. FIG. 2B shows a cross-sectional view of a first example device 120 that can result from the process 100 shown in FIG. 1B.

In many ways, the process 100 of FIG. 1B is similar to the process 10 of FIG. 1A. For example, the process 100 can begin with the formation of a first electrode 122 (Step 102), for example by depositing a material of the first electrode 122 onto a substrate 124. In an example, the bottom electrode 122 is deposited by evaporation. The formed first electrode 122 has a first surface 126 that is in contact with the substrate 124 and a second surface 128 that opposes or generally opposes the first surface 126. In an example, the first surface 126 and the second surface 128 are planar or substantially planar and are parallel or substantially parallel to one another. In the example shown in FIG. 2B, the first surface 126 is on a bottom side of the first electrode 122 and the second surface is on a top side of the first electrode 122 such that the substrate 124 and the first electrode 122 are on a bottom side of the device 120. For this reason, the first electrode 122 will also be referred to as "the bottom electrode 122," the first surface 126 will also be referred to as the "bottom surface 126," and the second surface 128 will also be referred to as the "top surface 128."

Next, a first layer 130 comprising a first material is formed on the bottom electrode 122 (Step 104). In an example, the first layer 130 is a first oxide layer 130 comprising a first oxide material. In an example, the first oxide layer 130 is deposited by atomic layer deposition (ALD) of the first oxide material or materials onto the bottom electrode 130. In other examples, the first layer 130 can comprise materials other than an oxide including, but not limited to, a nitride, a carbide, a metal or other conductive material, or a semiconductor material.

The depositing of the first material results in the first layer 130 having a first surface 132 that is in contact with the second surface 128 of the bottom electrode 122, and a second surface 134 that opposes or substantially opposes the first surface 132. In an example, the first surface 132 and the second surface 134 are planar or substantially planar and are parallel or substantially parallel to one another. In the example shown in FIG. 2B, the first and second surfaces 132 and 134 are on a bottom side and a top side of the first layer 130, respectively, and therefore will also be referred to herein as the "bottom surface 132" and the "top surface 134" for brevity and ease of description.

After forming the first layer 130, the process 100 of FIG. 1B can include positioning a template on the first oxide layer (Step 106). The template used in the process 100 of FIG. 1B can be similar or even identical to the template used in the process 10 of FIG. 1A. For example, the template 50 shown in FIG. 3 can be used as the template for step 106 of the process 100. In other words, the template 50 for the process 100 can include a template body 52 with a first template face 54, an opposing second template face 56, and a plurality of pores 58 that extend through the template body 52 from the first template face 54 to the second template face 56. The pores 58 act as mold cavities to form a corresponding structure onto the first layer 130. In an example, the template 50 is an ultrathin template, e.g., a template 50 with an aspect ratio of 8 or less, and is formed from an anodic aluminum oxide (AAO), also referred to as "the AAO template." Those of skill in the art, however, will be able to contemplate other materials that can be used to form the plurality of nanostructures.

Next, an array comprising a plurality of metal structures 140 are formed on the first layer 130 (Step 108). As described above, in some examples, the pores 58 of the template have a largest width in a lateral direction of 1 µm or less, for example 500 nm or less, such as 250 nm or less, for example 150 nm or less, such as 100 nm or less, such that the resulting structures 140 formed in the pores 58 will also be referred to as "nanostructures 140" or "nanoislands 140." In an example, the metal nanoislands 140 are formed by evaporation, which causes the metal material to form in one or more of the mold cavities in the AAO template. In some examples, the nanoislands 140 are formed with a largest size in a lateral direction (e.g., a diameter for nanoislands that are circular or generally circular in cross section) of from about 10 nm to about 150 nm, such as from about 20 nm to about 100 nm, such as from about 30 nm to about 90 nm.

After the nanostructures 140 are formed and sufficiently solidified, the template 50 can be removed and separated from the first layer 130 and the nanoislands 140 (Step 110). Then, a second layer 142 comprising a second material that is different from the first material of the first layer 130 is formed over the top of the nanoislands 140 and the first layer 130 (Step 112) such that the nanoislands 140 are sandwiched between the first layer 130 and the second layer 142.

In an example, the depositing of the second material results in the second layer 142 having a first surface 144 that is in contact with the second surface 134 of the first layer 130 and with at least a portion of the nanoislands 140, and a second surface 146 that opposes or substantially opposes the first surface 144. In an example, the first surface 144 and the second surface 146 are planar or substantially planar (except for the portions of the first surface 144 that are in contact with the nanoislands 140) and are parallel or substantially parallel to one another. In the example shown in FIG. 2B, the first and second surfaces 144 and 146 are on a bottom side and a top side of the second layer 142, respectively, and therefore will also be referred to herein as the "bottom surface 144" and the "top surface 146" for brevity and ease of description.

In practice, this sandwiching of the nanoislands 140 between the first layer 130 and the second layer 142 results in the nanoislands 140 being embedded at or near a junction 148 between the first material that forms the first layer 130 and the second material that forms the second layer 142. Depending on the first and second materials and the voltage being applied across the first layer 130 and the second layer 142, the junction 148 can provide for a function of the device 120.

In an example, the first layer 130 comprises an oxide material such that it is a first oxide layer 130 and the second layer 142 comprises a second oxide material so that it is a second oxide layer 142. The second oxide material of the second oxide layer 142 is different from the first oxide material of the first oxide layer 130. In an example, the second oxide layer 142 is formed by ALD, similar to the formation of the first oxide layer described with respect to Step 104, but involves the deposition of the second oxide material rather than the first oxide material. In other examples, the second layer 142 can comprise materials other than an oxide including, but not limited to, a nitride, a carbide, a metal or other conductive material, or a semiconductor material. For example, the first layer 130 can comprise an oxide (such as $HfO_2$), while the second layer 142 can comprise a nitride, a carbide, a metal, or a semiconductor. Similarly, in another example, the first layer 130 can comprise a nitride, a carbide, a metal, or a semiconductor, and the second layer 142 can comprise an oxide material. In yet another example, both the first layer 130 and the second layer 140 can be non-oxide materials, e.g., each can be one or more of a nitride, a carbide, a metal, or a semiconductor. However, the inventors envision that structures where both the first layer 130 and the second layer 142 are oxide materials will be some of the most common for electrical devices 120 that implement the nanostructures 140 formed by the process 100, such that the remainder of the disclosure will describe the process 100 where one or both of the layers 130, 142 are metal oxides, such as hafnia.

In an example, the process 100 includes forming a second electrode 150 (Step 114), for example by depositing a material of the second electrode 150 onto the second layer 142. The formed second electrode 150 has a first electrode surface 152 that is in electrical contact with the second surface 146 of the second layer 142 and a second electrode surface 154 that opposes or generally opposes the first electrode surface 152. In an example, the first electrode surface 152 and the second electrode surface 154 are planar or substantially planar and are parallel or substantially parallel to one another. In the example shown in FIG. 2B, the first and second electrode surfaces 152 and 154 are on a bottom side and a top side of the second electrode 150, respectively, and therefore will also be referred to herein as the "bottom electrode surface 152" and the "top electrode surface 154" for brevity and ease of description. Similarly, as shown in the example of FIG. 2B, the second electrode 150 is located on a top side of the device 120, e.g., opposite the bottom electrode 122, such that the second electrode 150 will also be referred to herein as the "top electrode 150."

In an example, the top electrode 150 can be patterned, e.g., the top electrode 150 can be formed by any feasible patterned deposition method. In an example, the top electrode 150 is coupled to the top surface 146 of the second layer 142 with an adhesive 156. In an example, the process 100 can optionally include forming one or more capping layers 158 on the top electrode surface 154 of the top electrode 150 (Step 116). In examples where the top electrode 150 is patterned, as in FIGS. 1B and 2B, then the capping layer 158 can also be patterned.

Figure 2C:
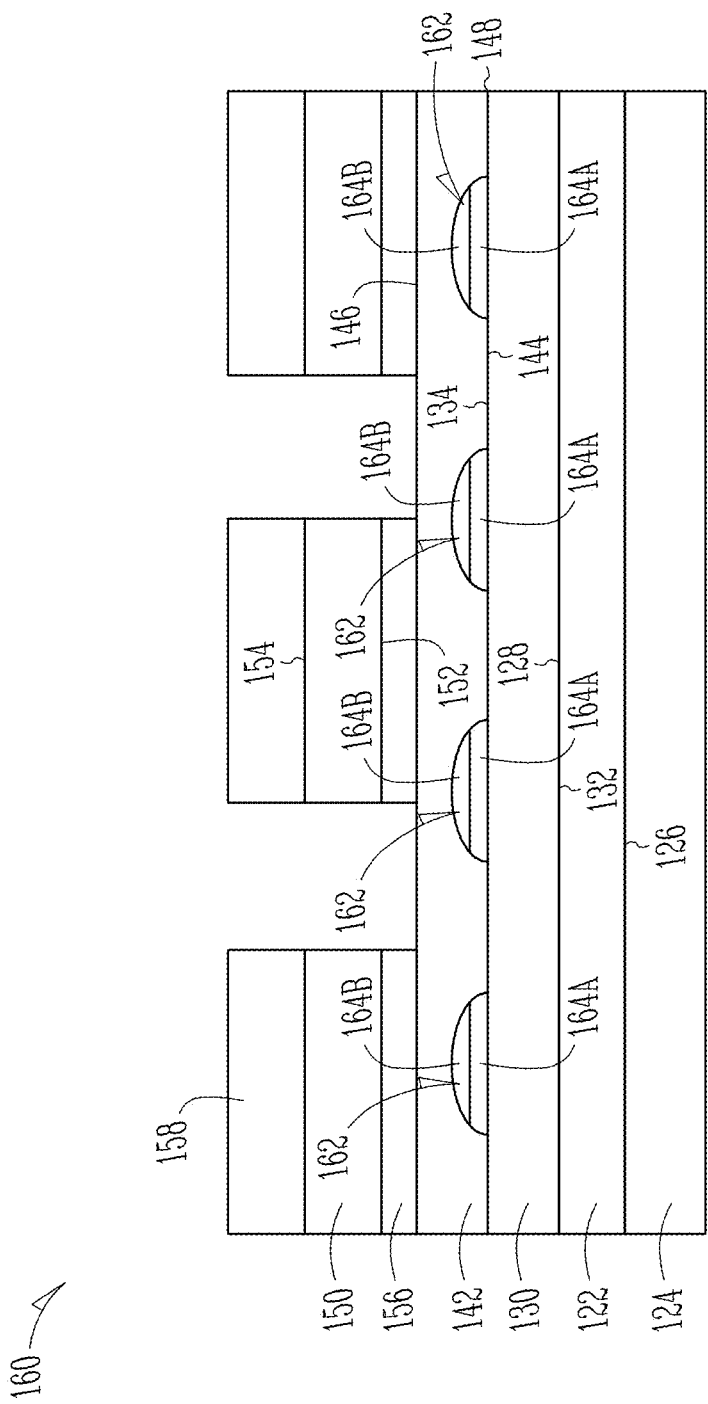
FIG. 2C is a cross-sectional side view of a second example device structure of an electronic device made according to the second example process of FIG. 1B.

In the example shown in FIG. 2B, the nanoislands 140 are all formed from a single material, which can be similar or even identical to the materials described above for the nanoislands 60 in FIG. 2A that result from the process 10 of FIG. 1A (such as from silver ($Ag^0$), gold ($Au^0$), cobalt ($Co^0$), nickel ($Ni^0$), palladium ($Pd^0$), platinum ($Pt^0$), ruthenium ($Ru^0$), titanium ($Ti^0$), or hafnium ($Hf^0$)). In another example of the process, the resulting device 160 is made so that at least some of its nanostructures 162 are formed out of more than one material, as shown in the example device 160 of FIG. 2C, which is similar to the device 120 in FIG. 2B except for the multi-layered nanostructures 162. In such an example, the step of forming the nanostructures 162 (e.g., Step 18 in the process 10 of FIG. 1A or Step 108 in the process 100 of FIG. 1B) includes forming a first nanoisland layer 164A on the top surface 134 of the first layer 130 for each of the nanoislands 162, wherein the first nanoisland layer 164A comprises a first material, followed by forming a second nanoisland layer 164B on the first nanoisland layer 164A for each of the nanoislands 162, wherein the second nanoisland layer 164B comprises a second material. In one example, both the first and second nanoisland layers 164A and 164B are formed from a metal material, although from different metal materials (such as from different compounds or from the same compound but with different sets of impurities). In another example, one or more of the first nanoisland layers 164A are formed from a metal material (such as Pt, Ti, Ag, etc.) and the corresponding second nanoisland layers 164B are formed from a non-metal material (such as an oxide, a carbide, a nitride, or a semiconductor material). In yet another example, one or more of the first nanoisland layers 164A are formed from a non-metal material (such as an oxide, a carbide, a nitride, or a semiconductor material) and the corresponding second nanoisland layers 164B are formed from a metal material (such as Pt, Ti, Ag, etc.).

Figure 4:
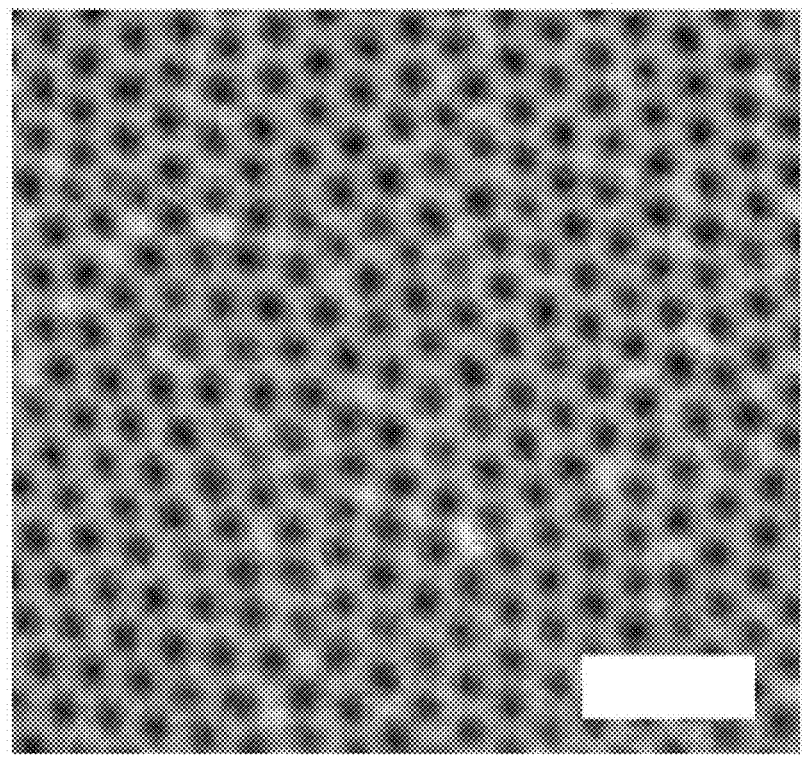
FIG. 4 is a top plan view of a scanning electron microscopy (SEM) image of an anodic aluminum oxide (AAO) template after forming the array of nanostructures as part of the process of FIG. 1A.

In order to investigate the effects of the processes described herein, the process 10 described above with respect to FIG. 1A was used to produce several examples of the electronic device 30 shown in FIG. 2A. Specifically, devices 30 were made with nanoisland structures formed out of platinum metal (Pt), titanium metal (Ti), and silver metal (Ag) onto a $HfO_2$ film formed by ALD. FIG. 4 shows an image captured via scanning electron microscope (SEM) of an example where platinum nanoislands have been formed on a $HfO_2$ thin film that has a thickness about 5 nm. FIG. 4 shows the ordered, periodic nanoisland arrays achievable through the simple template-assisted deposition process 10 of FIG. 1A. The nanoisland diameter, inter-island spacing, and the resulting area density were able to be precisely controlled through changes in the pore size by varying the anodization voltage during fabrication of the AAO template.

Each type of metal (i.e., Pt, Ti, and Ag) was used to form a first set of devices 30 with nanoislands 60 having a diameter of about 30 nm, while in a second set of devices 30 the nanoislands 60 having a diameter of about 90 nm were produced. For the sake of brevity, hereinafter each of these specific devices 30 will be referred to as follows: the device with platinum nanoislands having a diameter of about 30 nm is denoted as "PtD30;" the device with platinum nanoislands having a diameter of about 90 nm is denoted as "PtD90;" the device with titanium nanoislands having a diameter of about 30 nm is denoted as "TiD30;" the device with titanium nanoislands having a diameter of about 90 nm is denoted as "TiD90;" the device with silver nanoislands having a diameter of about 30 nm is denoted as "AgD30;" and the device with silver nanoislands having a diameter of about 90 nm is denoted as "AgD90." All electric current-voltage ("I-V") responses were obtained with the bias applied to the top electrode 70 and the bottom electrode 32 held at ground. A forming process (not shown) leading to the dielectric breakdown was used to initiate the subsequent SET/RESET operation.

To demonstrate the electrical performance of the embedded devices, the I-V character was analyzed over 50 cycles of DC voltage sweeps using a probe station. FIGS. 5A-5F show histograms of the SET voltage ($V_{SET}$, data series 170A-170F, respectively) and the RESET voltage ($V_{RESET}$, data series 172A-172F, respectively) for each type of device (data series 170A and 172A for PtD30 in FIG. 5A, data series 170B and 172B for TiD30 in FIG. 5B, data series 170C and 172C for AgD30 in FIG. 5C, data series 170D and 172D for PtD90 in FIG. 5D, data series 170E and 172E for TiD90 in FIG. 5E, and data series 170F and 172F for AgD90 in FIG. 5F) when compared to that of a bare $HfO_2$ control film (e.g., without any embedded nanoislands) (data series 176 for the $V_{SET}$ and data series 178 for the $V_{RESET}$ in each of FIGS. 5A-5F). The detailed statistical data of the $V_{SET}$ and $V_{RESET}$ values is presented in Table 1.

TABLE 1

Statistical results of $V_{SET}$ and $V_{RESET}$ comparing the bare $HfO_2$ and embedded $HfO_2$ memristors.

|  | SET Voltage (V) | | | RESET Voltage (V) | | |
| --- | --- | --- | --- | --- | --- | --- |
|  | Average | Std. Dev. | Reduction (%) | Average | Std. Dev. | Reduction (%) |
| Pt-D30 | 0.953 | 0.220 | 26.4 | −0.806 | 0.034 | 28.1 |
| Ti-D30 | 0.943 | 0.138 | 27.2 | −0.813 | 0.167 | 27.5 |
| Ag-D30 | 0.398 | 0.122 | 69.3 | −0.414 | 0.091 | 63.1 |
| Bare $HfO_2$ | 1.295 | 0.363 | — | −1.121 | 0.484 | — |
| Pt-D90 | 0.743 | 0.238 | 42.6 | −0.533 | 0.099 | 52.5 |
| Ti-D90 | 0.849 | 0.151 | 34.4 | −0.737 | 0.212 | 34.3 |
| Ag-D90 | 0.373 | 0.129 | 71.2 | −0.371 | 0.115 | 66.9 |

As can be seen by FIGS. 5A-5F and Table 1, the bare $HfO_2$ reference control films exhibited an average $V_{SET}$ and $V_{RESET}$ of 1.295±0.363 V and −1.121±0.484 V, respectively. Recent studies of embedded-$HfO_2$ based memristors showed a reduction in set and reset voltage and significant improvements to the uniformity. The ordered embedded nanoisland arrays of all metal types and diameters yielded a significant reduction in operating voltage compared to earlier studies involving embedded-$HfO_2$ based memristors.

Two distinct trends are observed in the performance of the ordered, embedded nanoisland arrays. The first trend shows Ag nanoislands of either size reduce both $V_{SET}$ and $V_{RESET}$ more effectively than either the Pt or the Ti nanoislands. For the D30 devices, the order of highest to lowest percentage reduction is Ag>Ti>Pt, while for the D90 devices the order of highest to lowest percentage reduction is Ag>Pt>Ti. Without being limited to a particular theory, the inventors posit that the high degree of reduction in the embedded Ag systems can be attributed to the migration of Ag ions from the middle of the $HfO_2$ film to the bottom. These devices exhibit both valence change memory (VCM) and an electrochemical metallization process (ECM), which can involve an electrochemical metal deposition and dissolution cycles that can enable switching between active and inert electrodes. The second trend shows that generally the larger diameter D90 systems reduce both the $V_{SET}$ and $V_{RESET}$ values more effectively than the smaller D30 counterparts, but display slightly broader distributions (e.g., have a higher standard deviation) of the $V_{SET}$ and $V_{RESET}$ values.

Figure 5A:
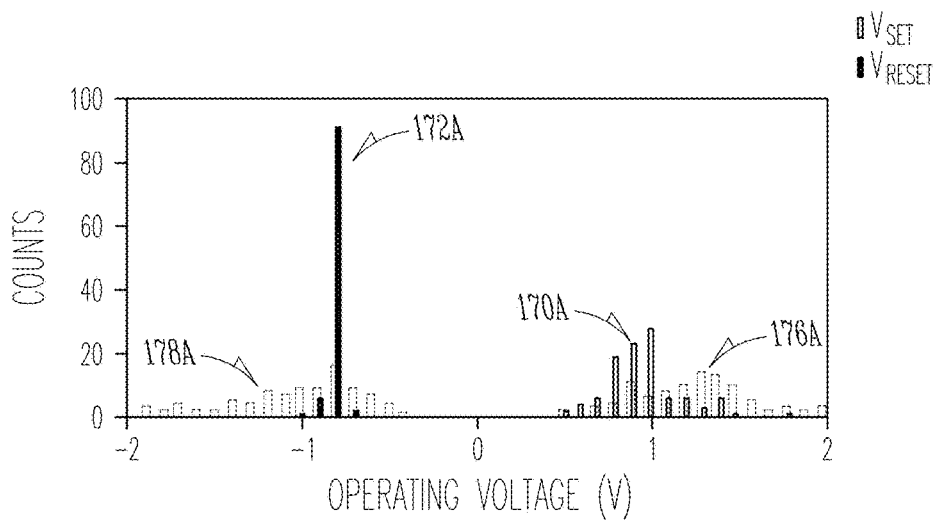
FIG. 5A is a histogram of operating voltage ($V_{SET}$ and $V_{RESET}$) of an example platinum-embedded (Pt-embedded) device comprising an array of platinum nanostructures having a diameter of about 30 nm embedded in a $HfO_2$ structure compared to the operating voltage of a control device comprising a bare (not embedded with nanostructures) $HfO_2$ film.
Figure 5B:
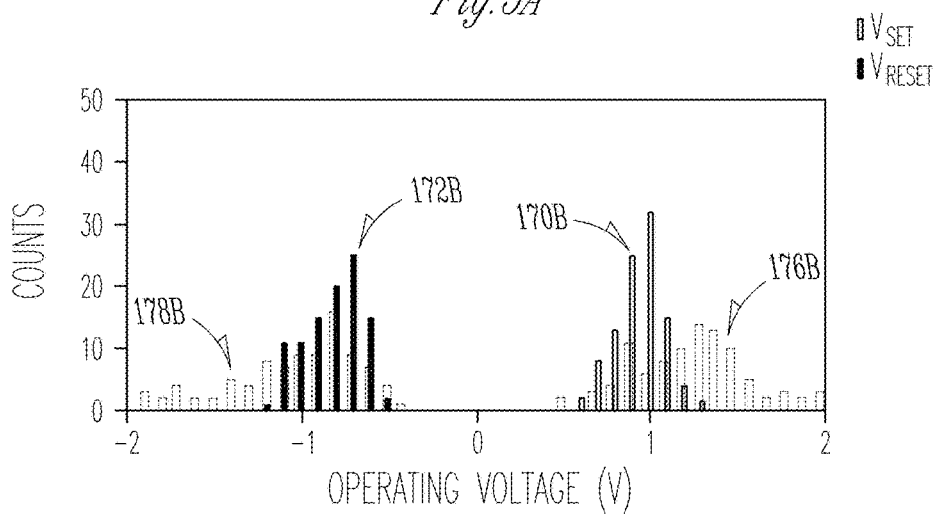
FIG. 5B is a histogram of operating voltage ($V_{SET}$ and $V_{RESET}$) of an example titanium-embedded (Ti-embedded) device comprising an array of titanium nanostructures having a diameter of about 30 nm embedded in a $HfO_2$ structure compared to the operating voltage of the non-embedded control device.
Figure 5C:
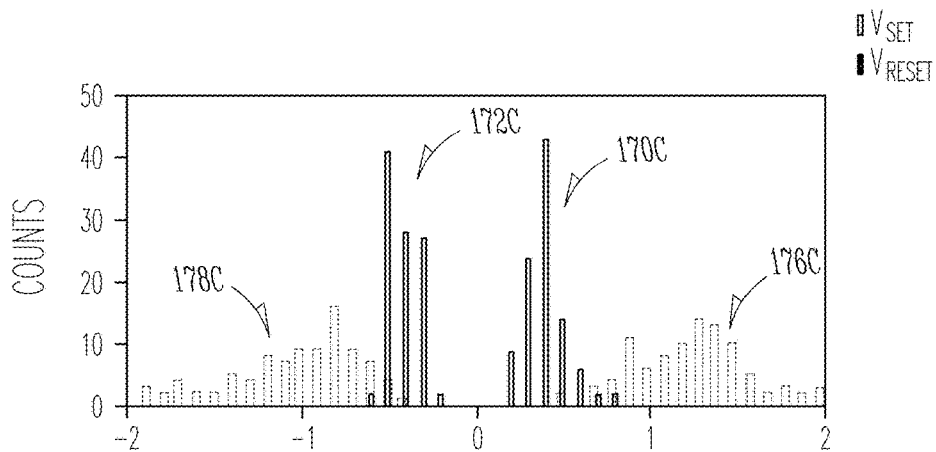
FIG. 5C is a histogram of operating voltage ($V_{SET}$ and $V_{RESET}$) of a silver-embedded (Ag-embedded) device comprising an array of silver nanostructures having a diameter of about 30 nm embedded in a $HfO_2$ structure compared to the operating voltage of the non-embedded control device.
Figure 5D:
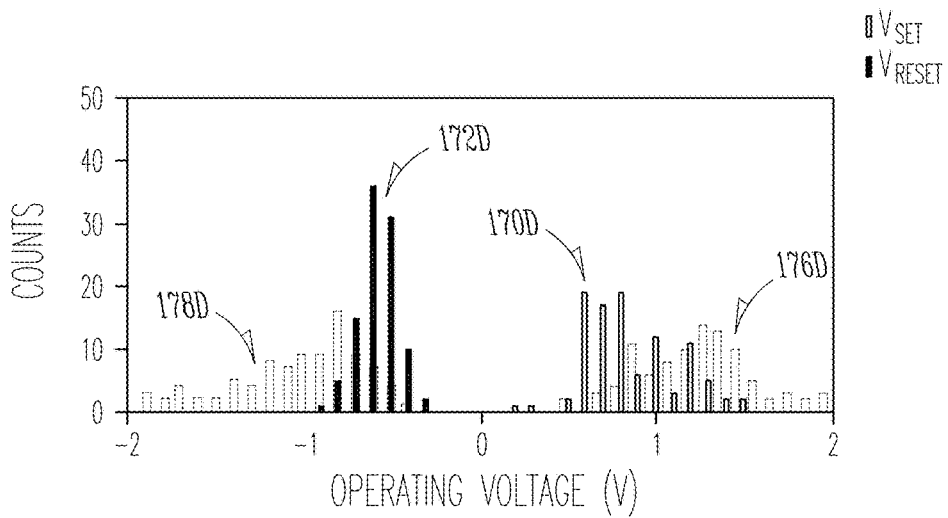
FIG. 5D is a histogram of operating voltage ($V_{SET}$ and $V_{RESET}$) of another example Pt-embedded device comprising an array of platinum nanostructures having a diameter of about 90 nm embedded in a $HfO_2$ structure compared to the operating voltage of the non-embedded control device.
Figure 5E:
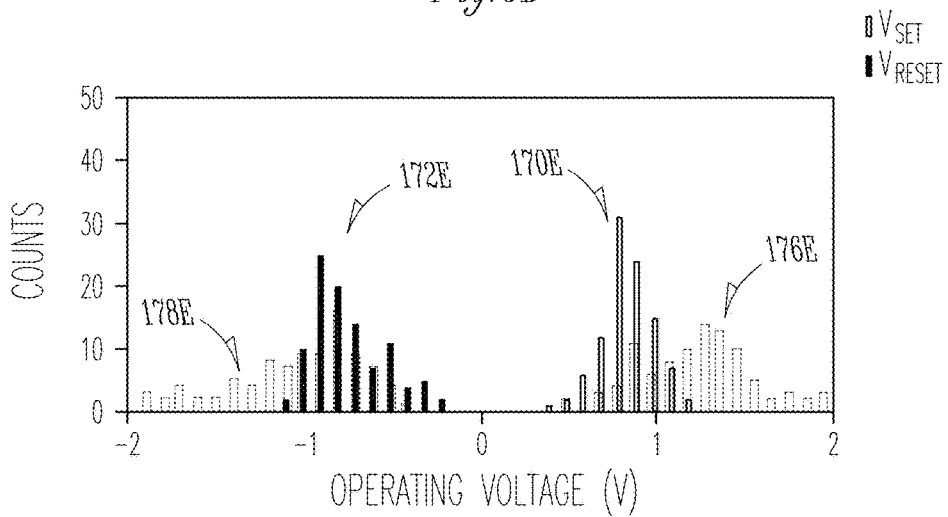
FIG. 5E is a histogram of operating voltage ($V_{SET}$ and $V_{RESET}$) of another example Ti-embedded device comprising an array of titanium nanostructures having a diameter of about 90 nm embedded in a $HfO_2$ structure compared to the operating voltage of the non-embedded control device.
Figure 5F:
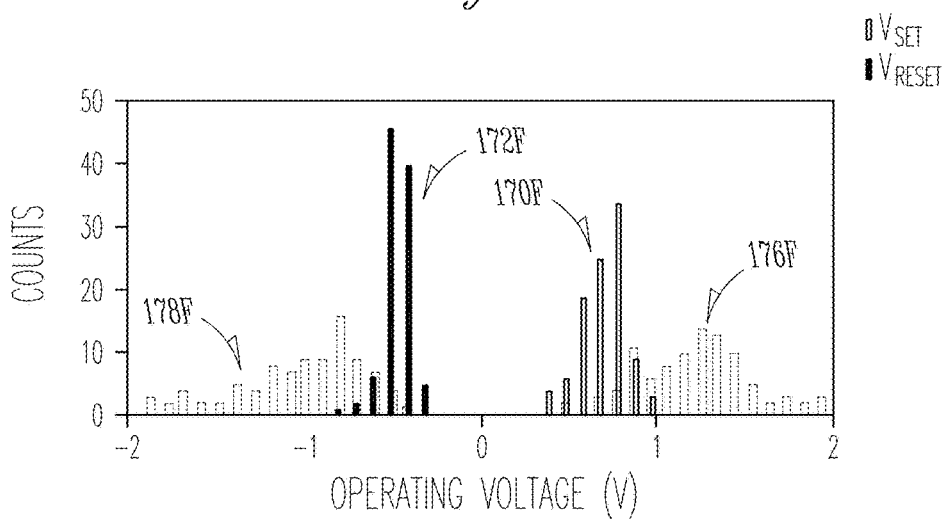
FIG. 5F is a histogram of operating voltage ($V_{SET}$ and $V_{RESET}$) of another example Ag-embedded device comprising an array of silver nanostructures having a diameter of about 90 nm embedded in a $HfO_2$ structure compared to the operating voltage of the non-embedded control device.
Figure 5G:
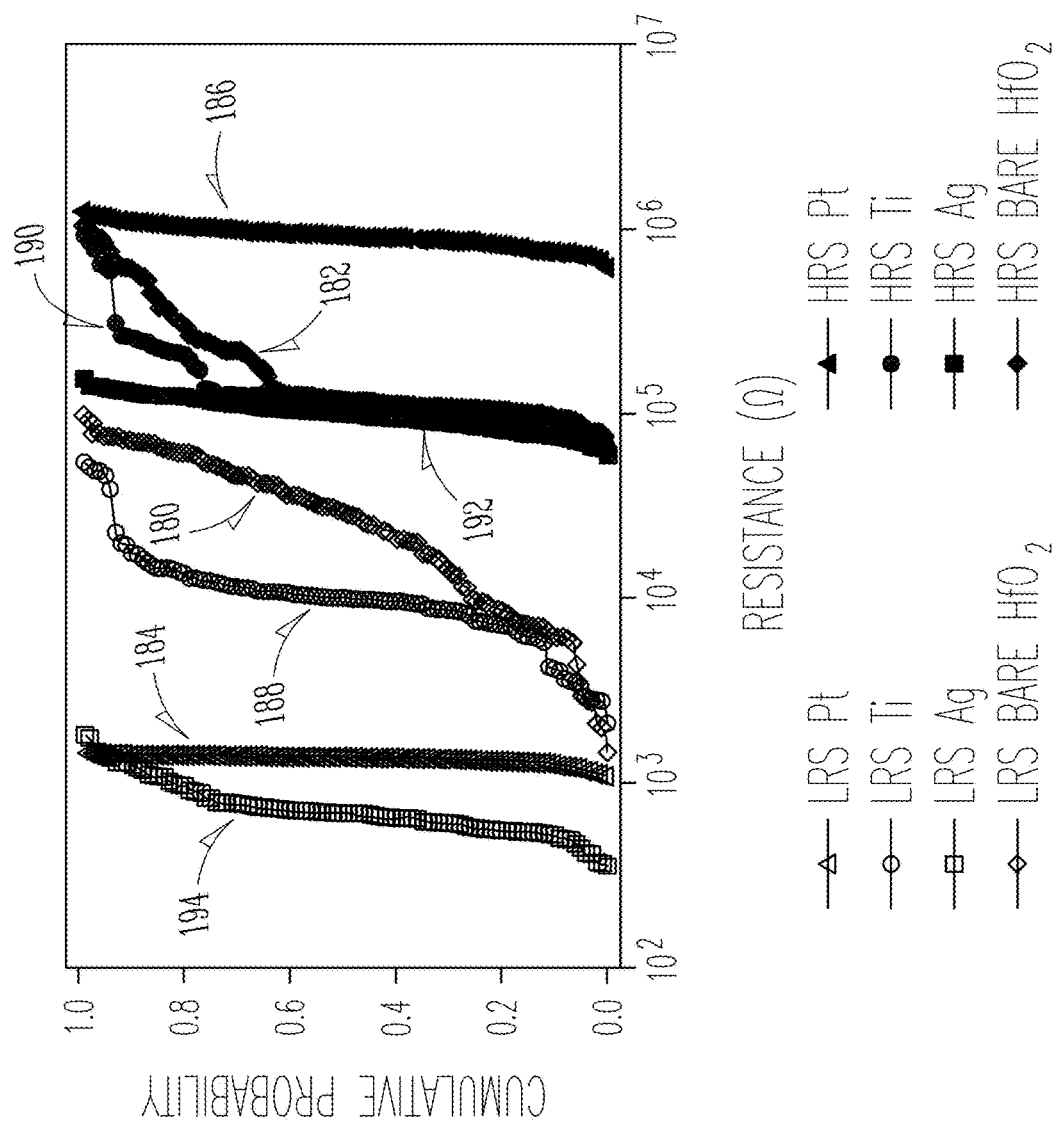
FIG. 5G is a plot of the resistance cumulative probability of the embedded devices of FIGS. 5A, 5B, and 5C (embedded with 30 nm diameter nanostructures) and the non-embedded control device at low-resistance state (LRS) and high-resistance state (HRS).
Figure 5H:
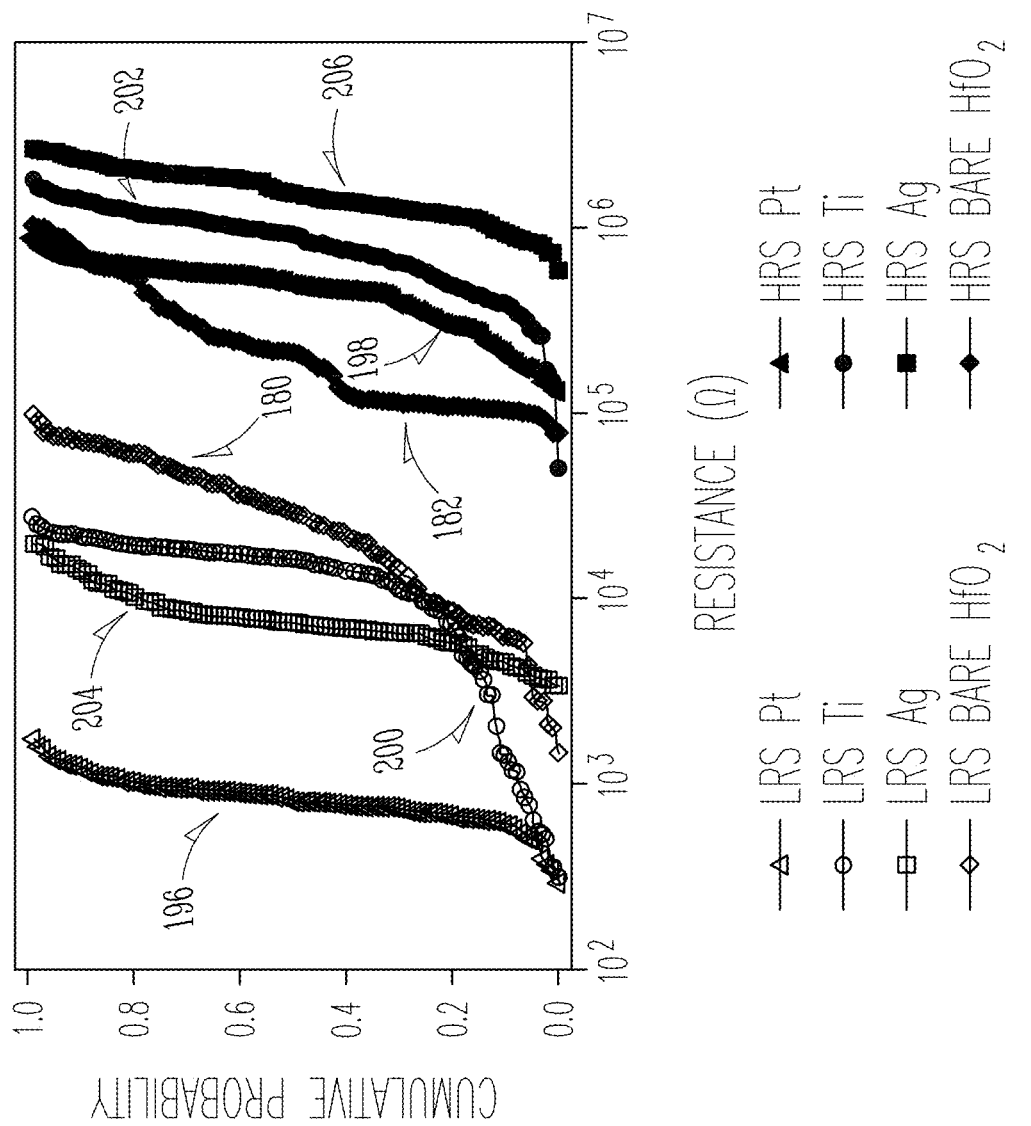
FIG. 5H is a plot of the resistance cumulative probability of the embedded devices of FIGS. 5D, 5E, and 5F (embedded with 90 nm diameter nanostructures) and the non-embedded control device at LRS and HRS.

The ordered, embedded nanoisland systems were also found to significantly enhance cycle-to-cycle resistance uniformity compared to the bare $HfO_2$ reference films. FIGS. 5G and 5H show plots of the cumulative probability of resistance for 50 cycles between the high-resistance state (HRS) and the low-resistance state (LRS) of both the reference devices and the devices that include the embedded nanoislands of the present disclosure. FIG. 5G shows the data for the devices with nanoislands having a diameter of about 30 nm and FIG. 5H shows the data for the devices with nanoislands having a diameter of about 90 nm. Data series 180 and 182 shows the data for the LRS and HRS, respectively, of the reference device in both FIG. 5G and FIG. 5H. In FIG. 5G, data series 184 and 186 include the LRS and HRS, respectively, of the Pt-D30 device, data series 188 and 190 include the LRS and HRS, respectively, of the Ti-D30 device, and data series 192 and 194 include the LRS and HRS, respectively, of the Ag-D30 device. In FIG. 5H, data series 196 and 198 include the LRS and HRS, respectively, of the Pt-D90 device, data series 200 and 202 include the LRS and HRS, respectively, of the Ti-D90 device, and data series 204 and 206 include the LRS and HRS, respectively, of the Ag-D90 device. Full statistics for the data is included in Table 2.

TABLE 2

The statistical results of resistance at LRS and HRS comparing the bare $HfO_2$ and embedded $HfO_2$ memristors.

|  | Low Resistance (KΩ) | | | High Resistance (MΩ) | | |
| --- | --- | --- | --- | --- | --- | --- |
|  | Average | Std. Dev. | CV (%) | Average | Std. Dev. | CV (%) |
| Pt-D30 | 1.351 | 0.072 | 5.3 | 0.919 | 0.101 | 11.0 |
| Ti-D30 | 12.051 | 9.999 | 83.0 | 0.165 | 0.155 | 93.9 |
| Ag-D30 | 0.750 | 0.285 | 38.0 | 0.096 | 0.024 | 25.0 |
| Bare $HfO_2$ | 26.441 | 22.491 | 85.1 | 0.229 | 0.227 | 99.1 |
| Pt-D90 | 0.939 | 0.253 | 26.9 | 0.550 | 0.115 | 20.9 |
| Ti-D90 | 13.862 | 6.983 | 50.4 | 0.877 | 0.386 | 44.0 |
| Ag-D90 | 8.134 | 3.562 | 43.8 | 1.601 | 0.515 | 32.2 |

As can be seen by FIGS. 5G and 5H and Table 2, the bare $HfO_2$ reference films exhibit significant changes in the resistance values and consequently have large coefficients of variation (CV) for both the LRS data 180 and the HRS data 182. The PtD30 device displayed exemplary uniformity enhancements, with an overall reduction in the CV of about 95% for the LRS 184 and about an 89% reduction in CV for the HRS 186. The PtD90 device also significantly reduced the CV by a factor of about 68% for the LRS 196 and by about 79% for the HRS 198. The Ag-embedded films similarly yielded stark improvements to the uniformity, with a reduction in CV for the LRS and HRS of about 55% and about 75%, respectively, for the AgD30 device (FIG. 5G, data series 192 and 194, respectively) and about 41% and about 56%, respectively, in the AgD90 device (FIG. 5H, data series 204 and 206). The devices embedded with ordered Ti nanoisland arrays, however, exhibited only nominal improvements (about 5% or less) in uniformity for the TiD30 device (FIG. 5G, data series 188 and 190) and moderate improvements for the TiD90 device (about 41% in CV for LRS 200 and about 56% in CV for HRS 202).

Based on the results shown in FIGS. 5A-5H and Tables 1 and 2, it appears that the embedded nanoislands formed by the process of the present disclosure clearly reduce the operating voltage (with the Ag-embedded devices appearing to provide the highest reduction in $V_{SET}$ (data series 170C and 170F) and $V_{RESET}$ (data series 172C and 172F)) while improving cycle uniformity (with the Pt-embedded devices appearing to provide the most improvement in cycle uniformity). Without wishing to be bound by any particular theory, the inventors expect that the differences in performance between the embedded nanoisland systems are attributable to the underlying switching mechanisms. The inventors conclude that the Ag-embedded devices work under the ECM principles involving cation migration mentioned above and that the Pt-embedded and Ti-embedded devices leverage the filamentary dynamics of oxygen vacancies to form a valence change memory (VCM).

The inventors also anticipate that the physical origin of the resistance fluctuations arises from the variation in the number and/or size of the conductive filaments or ion motion associated with the generation and recombination of oxygen vacancies. The inventors further contend that the enhanced performance uniformity is attributable to the confinement of the conductive filament growth pathway. Simulations of the electric field distribution surrounding embedded species within a dielectric film matrix showed that the highest field concentration occurs at the edge of nanostructure, favorable for both the electrochemical reduction and oxygen vacancy migration processes. It is accepted that embedding metal nanoislands within the oxide thin film concentrates the electric field such that the fast oxygen reduction occurs only between the top electrode and the location of the nanoisland array. Controlled growth of the conductive filamentary channel is subsequently achieved by electric field modulation, manifested as a reduction in operating voltages and a narrowing of their subsequent distributions.

Figure 6A:
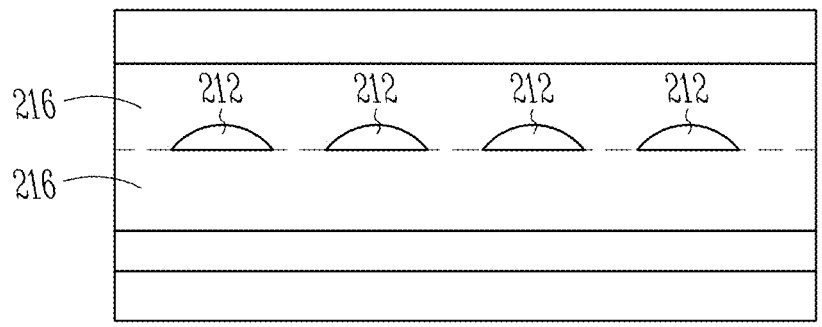
FIG. 6A is a cross-sectional view of an example device with an array of nanostructures embedded between a pair of oxide layers that have approximately the same thickness.
Figure 6B:
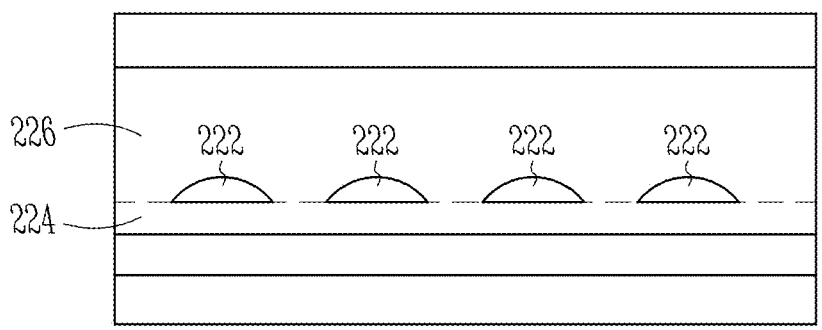
FIG. 6B is a cross-sectional view of an example device with an array of nanostructures embedded between a relatively thin oxide layer and a relatively thick oxide layer.

Embedding ordered nanoisland arrays to effectively limit the variability that occurs in bare $HfO_2$ memristive films generates a secondary challenge of narrowing the $V_{SET}$ and the reset resistance distributions. The inventors have found that translating the position of the nanoisland array along the thickness dimension of the oxide structure to exert influence on the switching performance addresses such issues. Altering the sequence in FIG. 1A to deposit only a 1 nm $HfO_2$ thin film for the first oxide layer in Step 14 shifted the placement of a PtD90 nanoisland array from the film middle (e.g., in a device where both the first oxide film of Step 14 and the second oxide film of Step 22 have approximately the same thickness), denoted hereinafter as "m-PtD90," to the film bottom (defined by the thickness of the film formed in Step 14 above the bottom electrode), denoted hereafter as "b-PtD90." A cross-sectional view of a m-PtD90 device 210 is shown in FIG. 6A, with an array of nanoislands 212 embedded between a first oxide layer 214 and a second oxide layer 216 that have approximately the same thickness. FIG. 6B is a cross-sectional view of a b-PtD90 device 220, with an array of nanoislands 222 embedded between a relatively thin first oxide layer 224 and a relatively thick second oxide layer 226.

Figure 7A:
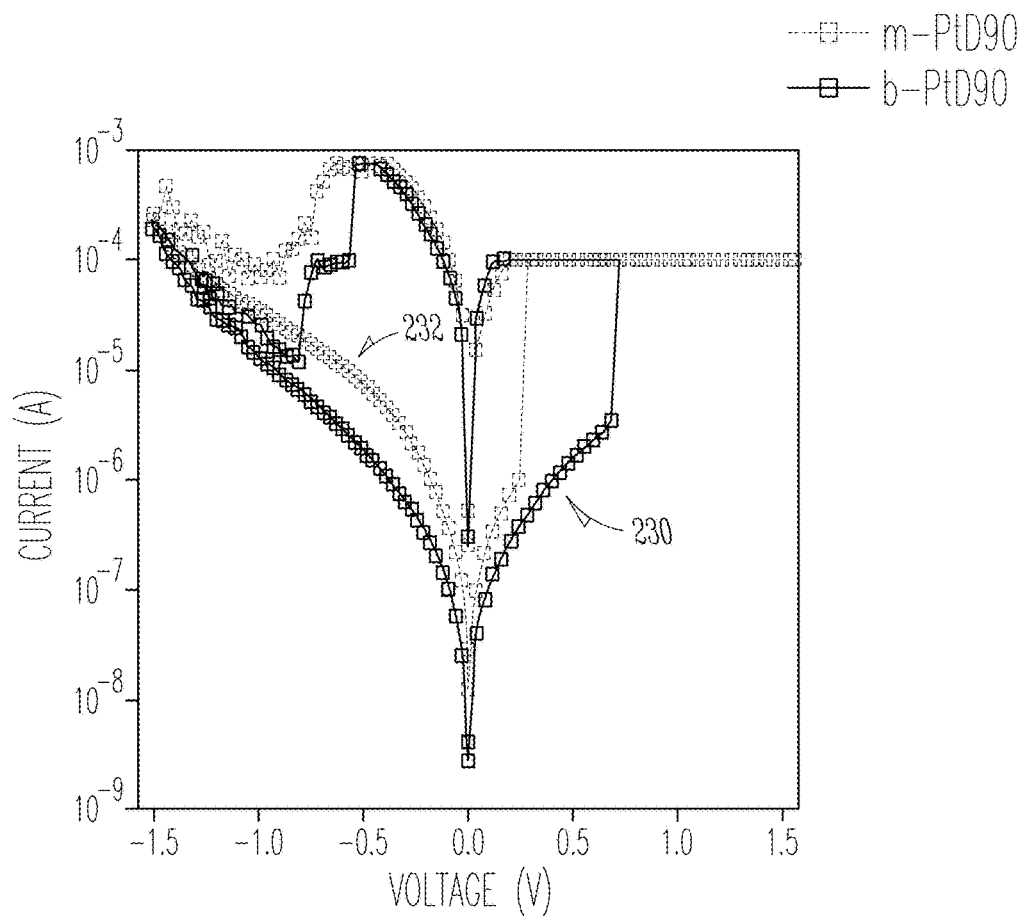
FIG. 7A is a plot of the current-voltage (I-V) response of a first platinum-embedded (Pt-embedded) device comprising an array of platinum nanostructures having a diameter of about 90 nm embedded at or near the middle thickness of a $HfO_2$ structure compared to the I-V response of a comparable second Pt-embedded device comprising an array of platinum nanostructures having a diameter of about 90 nm embedded near the bottom of a comparable $HfO_2$ structure.
Figure 7B:
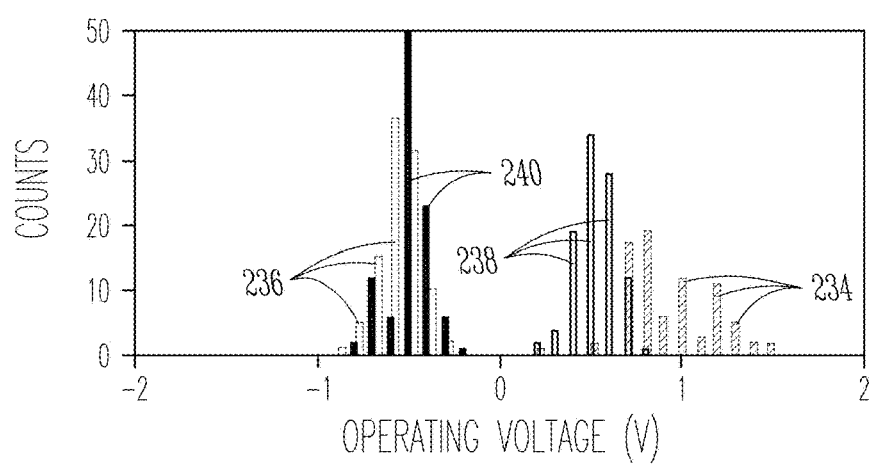
FIG. 7B is a histogram of operating voltage operating voltage ($V_{SET}$ and $V_{RESET}$) of the first Pt-embedded device and the comparable second Pt-embedded device of FIG. 7A.
Figure 7C:
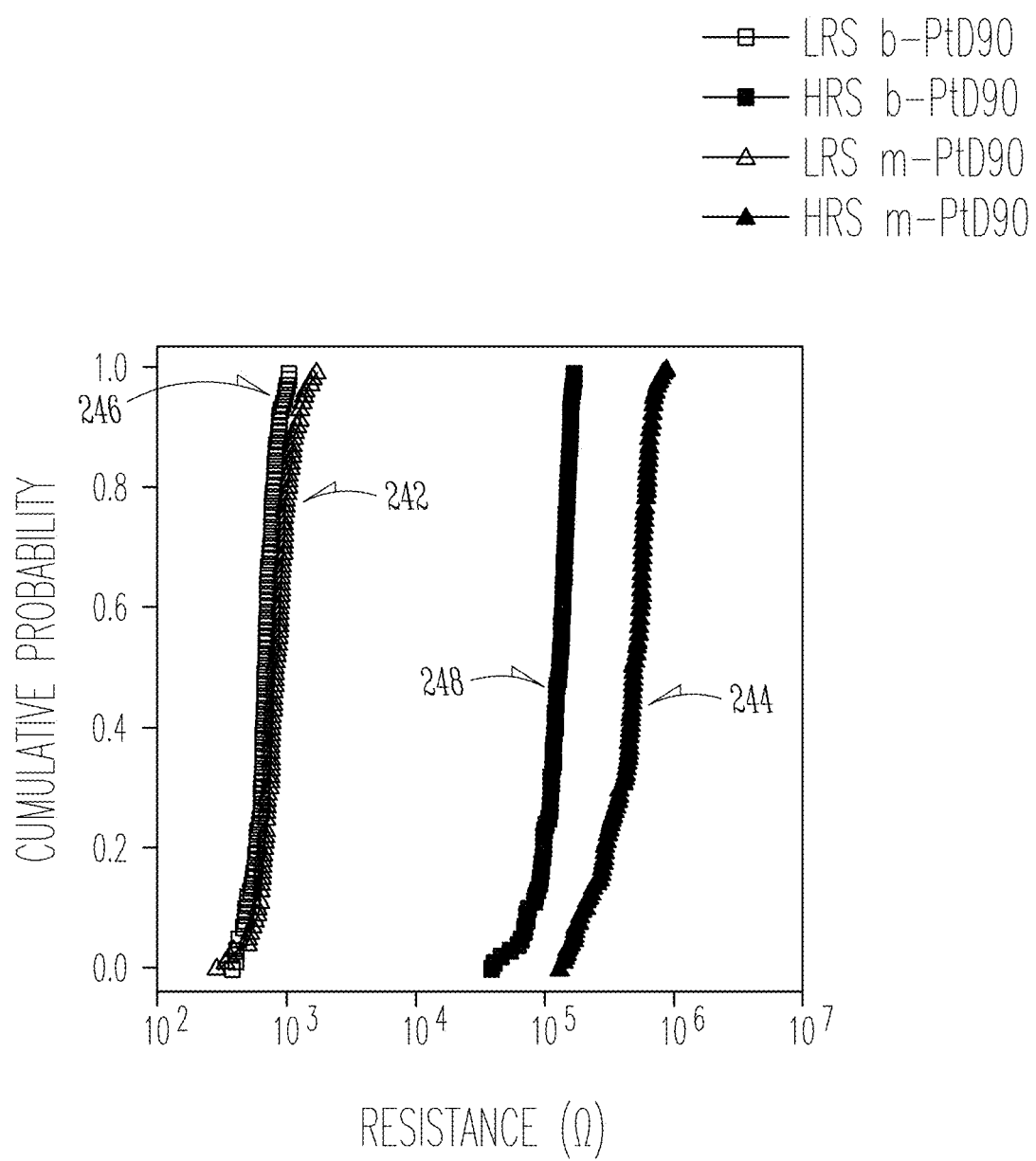
FIG. 7C is a comparison of cumulative probability of the resistance at LRS and HRS for the first Pt-embedded device and the comparable second Pt-embedded device of FIG. 7A.

FIG. 7A compares the I-V responses of the m-PtD90 device 210 (data series 230) to that of the b-PtD90 device 220 (data series 232). FIG. 7B shows a histogram of the operating voltages, with data series 234 representing the $V_{SET}$ of the m-PtD90 device 210, data series 236 representing the $V_{RESET}$ of the m-PtD90 device 210, data series 238 representing the $V_{SET}$ of the b-PtD90 device 220, and data series 240 representing the $V_{RESET}$ of the b-PtD90 device 220. As can be seen in FIG. 7B, the b-PtD90 device 220 exhibited a significant reduction in the $V_{SET}$ (data series 239) compared to that of the m-PtD90 device 210 (data series 234). As can also be seen in FIG. 7B, the b-PtD90 device 20 exhibited a narrower overall $V_{SET}$ distribution compared to that of the m-PtD90 device 210. FIG. 7C shows resistance distributions for the LRS and HRS, with data series 242 and 244 showing the LRS and HRS data, respectively, for the m-PtD90 device 210 and data series 246 and 248 showing the LRS and HRS data, respectively, for the b-PtD90 device 220. As can be seen in FIG. 7C, the b-PtD90 device 220 has a significantly reduced resistance at the HRS (data series 248) compared to that of the m-PtD90 device 210 (data series 244). The inventors contend that this reduction likely originates from adjusting the space between the tip of the filament and the bottom electrode, a gap that ultimately dictates the HRS and $V_{SET}$. The b-PtD90 device 220 thus produces a significantly lower HRS due to the smaller gap formed by reset process compared to the m-PtD90 device 210. The reduction in gap distance also produces larger electric fields that further facilitate ion migration, thus explaining the observed reduction $V_{SET}$ in FIG. 7B.

Figure 7D:
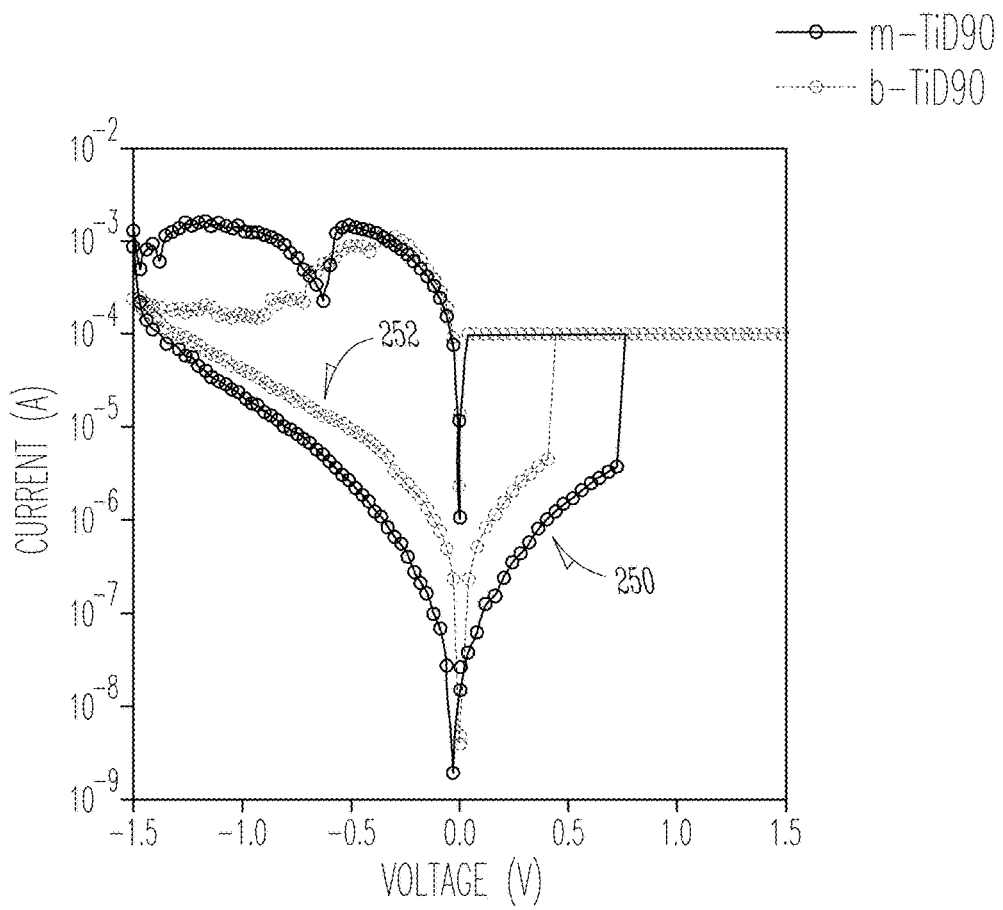
FIG. 7D is a plot of the current-voltage (I-V) response of a first titanium-embedded (Ti-embedded) device comprising an array of titanium nanostructures having a diameter of about 90 nm embedded at or near the middle thickness of a $HfO_2$ structure compared to the I-V response of a comparable second Ti-embedded device comprising an array of titanium nanostructures having a diameter of about 90 nm embedded near the bottom of a comparable $HfO_2$ structure.
Figure 7E:
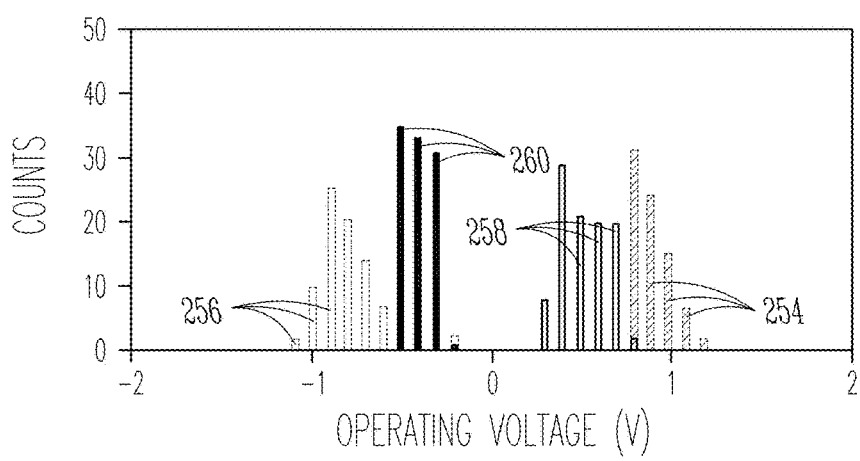
FIG. 7E is a histogram of operating voltage operating voltage ($V_{SET}$ and $V_{RESET}$) of the first Ti-embedded device and the comparable second Ti-embedded device of FIG. 7D.
Figure 7F:
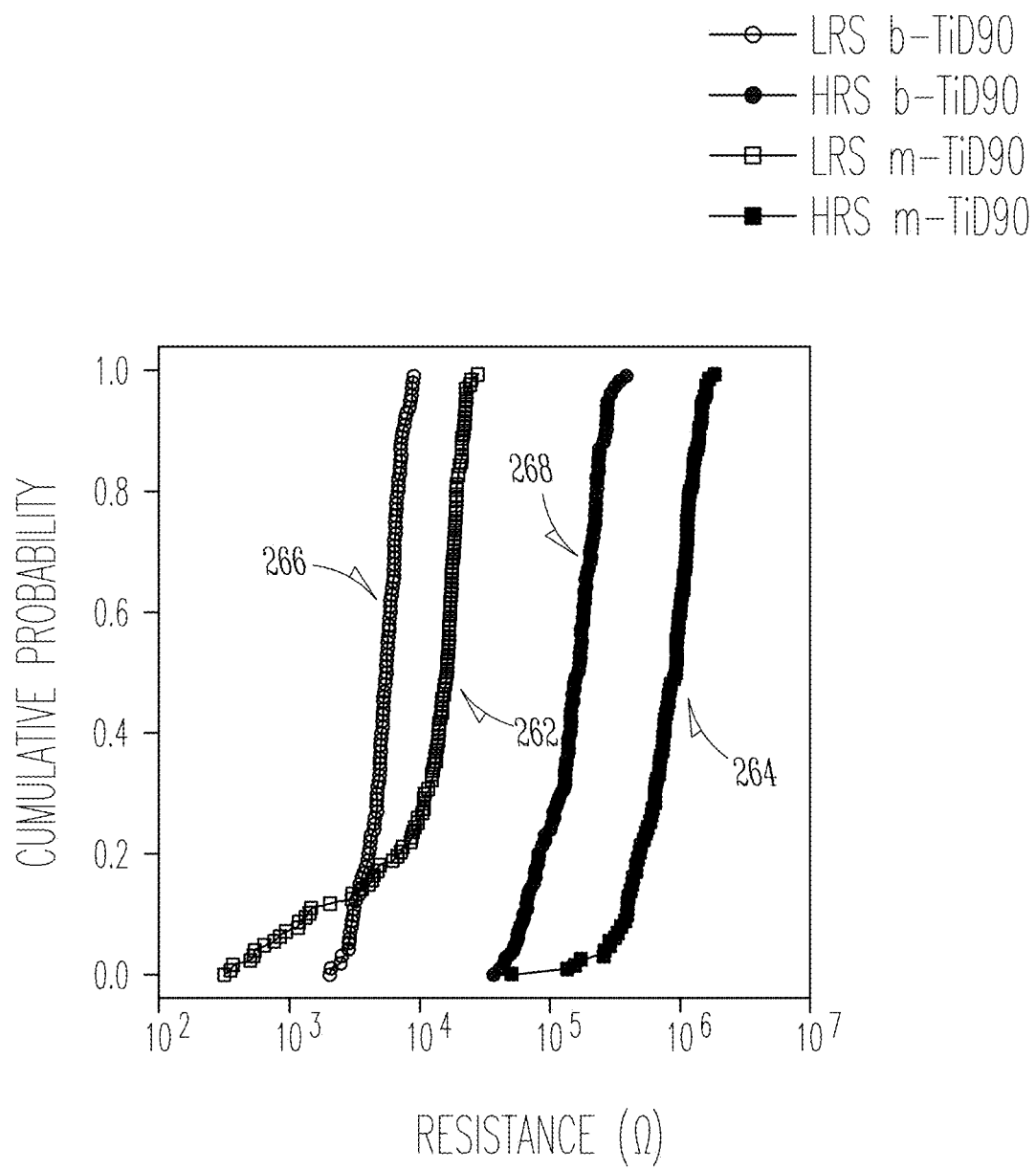
FIG. 7F is a comparison of cumulative probability of the resistance at LRS and HRS for the first Ti-embedded device and the comparable second Ti-embedded device of FIG. 7D.

FIGS. 7D-7F show that there were similar improvements were also observed when comparing a device with a TiD90 array embedded in a middle of the oxide structure, denoted hereinafter as "m-TiD90" to a device with the TiD90 array embedded near the bottom of the oxide structure, denoted hereinafter as "b-TiD90" (e.g., the same structures of the devices 210 and 220 in FIGS. 6A and 6B, but with titanium nanoislands rather than platinum) FIG. 7D compares the I-V responses of the m-TiD90 device (data series 250) to that of the b-TiD90 device (data series 252). FIG. 7E shows a histogram of the operating voltages, with data series 254 and 256 showing the $V_{SET}$ and $V_{RESET}$ data, respectively, for the m-TiD90 device, and data series 258 and 260 showing the $V_{SET}$ and $V_{RESET}$ data, respectively, for the b-TiD90 device. FIG. 7F shows resistance distributions for the LRS and HRS, with data series 262 and 264 showing the LRS and HRS data, respectively, for the m-TiD90 device and data series 266 and 268 showing the LRS and HRS data, respectively, for the b-TiD90 device. FIGS. 7D-7F further demonstrate what appears to be a strong correlation between the reset process and the position of the nanoisland arrays along the thickness dimension of the oxide structure in which the nanoisland structures are embedded.

Figure 8B:
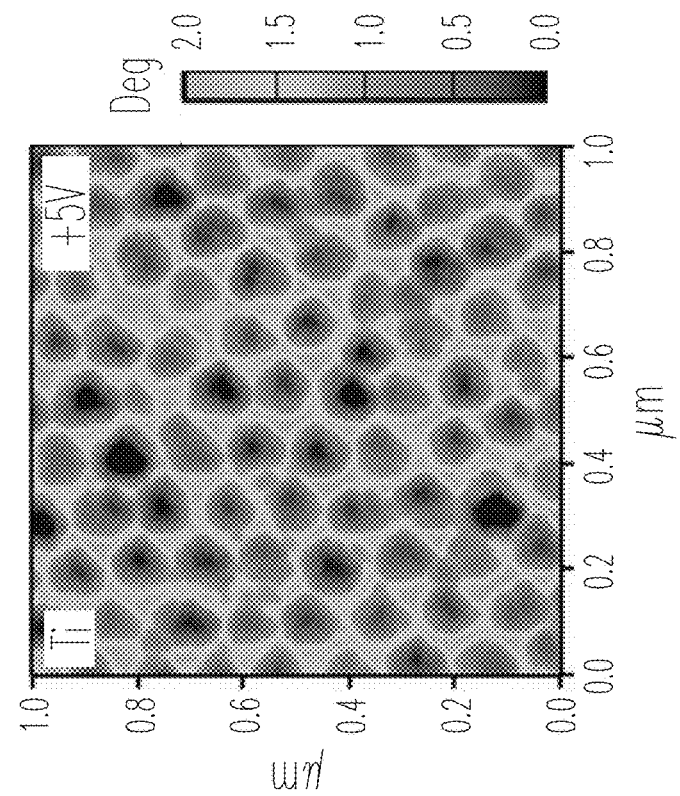
FIG. 8B is an electrostatic force microscopy (EFM) image of the Ti-embedded device of FIG. 5E (90 nm diameter Ti nanostructures embedded in $HfO_2$) under application of +5 V to the device prior to the application of bias.
Figure 8A:
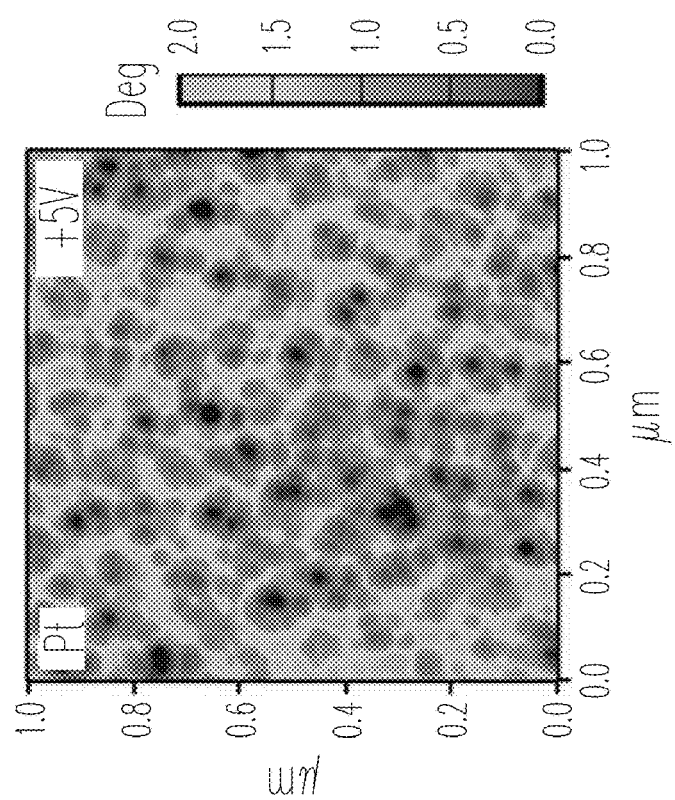
FIG. 8A is an electrostatic force microscopy (EFM) image of the Pt-embedded device of FIG. 5D (90 nm diameter Pt nanostructures embedded in $HfO_2$) under application of +5 V to the device.
Figure 8D:
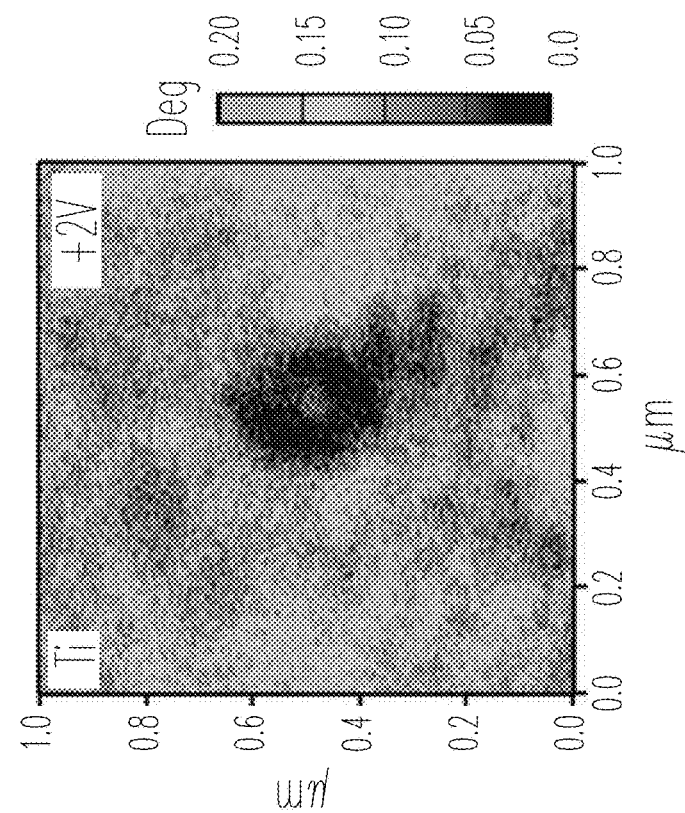
FIG. 8D is an electrostatic force microscopy (EFM) image of the Ti-embedded device of FIGS. 5E and 8B (90 nm diameter Ti nanostructures embedded in $HfO_2$) after 50 cycles of local voltage sweeping.
Figure 8C:
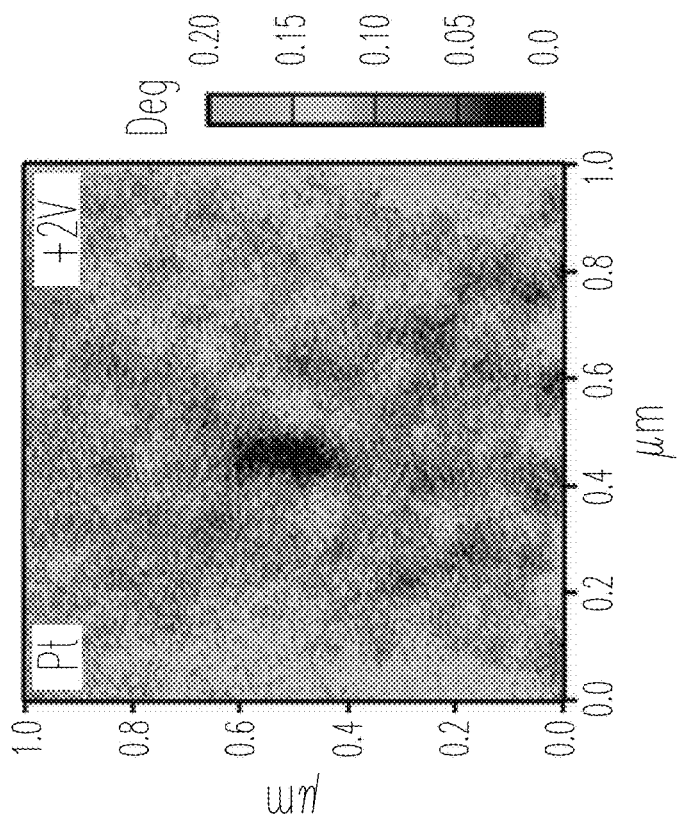
FIG. 8C is an electrostatic force microscopy (EFM) image of the Pt-embedded device of FIGS. 5D and 8A (90 nm diameter Pt nanostructures embedded in $HfO_2$) after 50 cycles of local voltage sweeping.

The local carrier distribution and conductivity of the embedded-nanoisland devices were studied via electrostatic force microscopy (EFM) and conductive atomic force microscopy (c-AFM) to more fully understand the role different metal nanoislands play during the switching process as an electric field concentrator. EFM detects charge accumulations with high lateral resolution and has been found to be a reliable characterization tool for ion dynamics. The Pt-D90 and Ti-D90 devices were measured using a platinum-iridium (Pt—Ir) c-AFM probe as a moveable top electrode. FIGS. 8A and 8B shows a 1 μm×1 μm EFM phase images of the PtD90 device (FIG. 8A) and of the TiD90 device (FIG. 8B). The images for FIGS. 8A and 8B were first collected prior to the local application of bias. After sweeping a bias via the conductive tip for 50 cycles, EFM phase images were again collected for the PtD90 device (FIG. 8C) and the TiD90 device (FIG. 8D). The dark blue areas observed in the middle of the images indicate the position of the applied bias and the negative phase change represents the detection of positive carriers. A significantly larger carrier accumulation is observed in the immediate vicinity of the nanoislands in the TiD90 device, which reacted with the HfO$_2$ layers during the deposition Step 22 of FIG. 1A to generate additional oxygen vacancies. The resulting reduced interfacial layer around the Ti nanoislands is expected to effectively serve as oxygen reservoir which is strengthened during successive voltage sweeping, yielding a pronounced increase in the density of oxygen vacancies with each subsequent operating cycle.

Figure 8F:
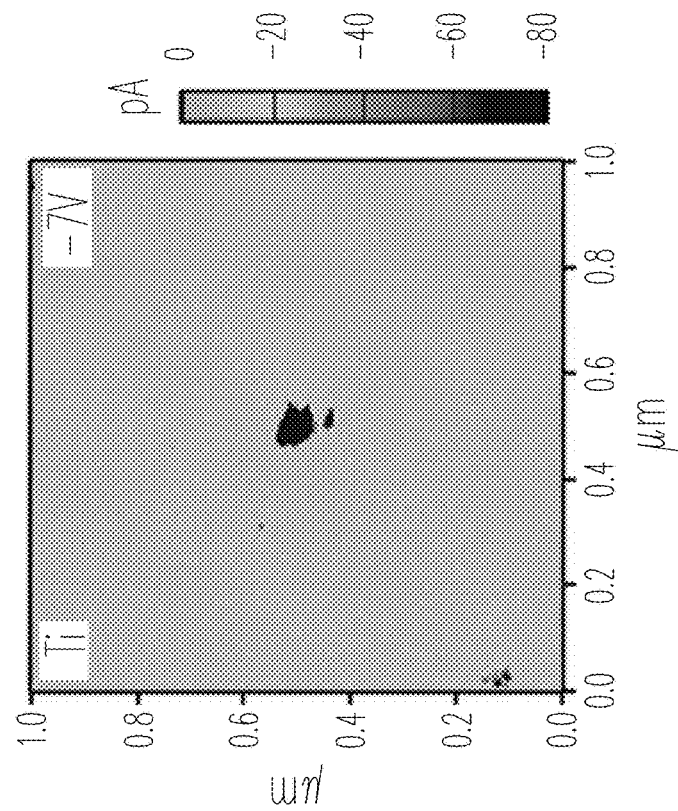
FIG. 8F is a conductive atomic force microscopy (c-AFM) image of the Ti-embedded device of FIGS. 5E, 8B, and 8D (90 nm diameter Ti nanostructures embedded in $HfO_2$) after the 50 cycles of local voltage sweeping.
Figure 8E:
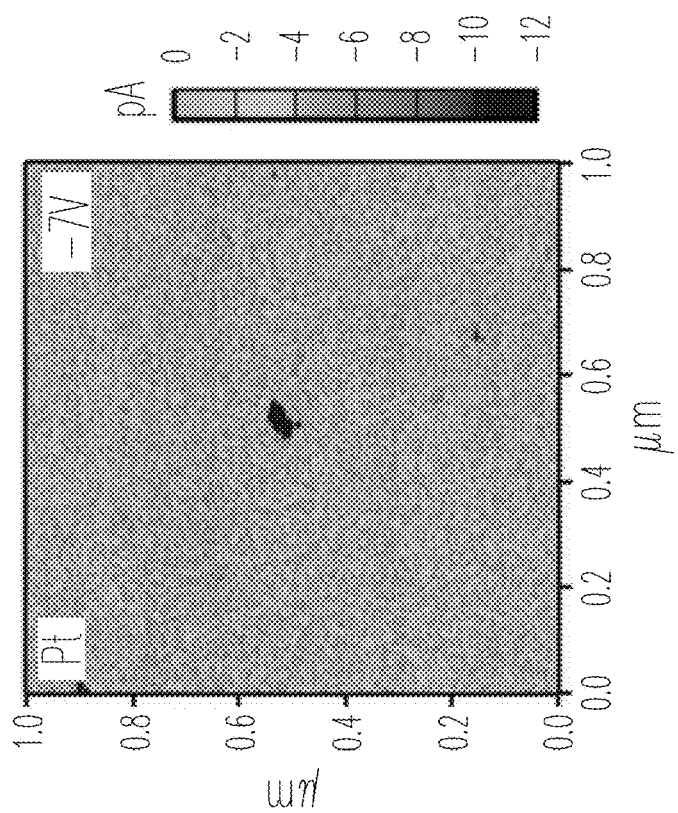
FIG. 8E is a conductive atomic force microscopy (c-AFM) image of the Pt-embedded device of FIGS. 5D, 8A, and 8C (90 nm diameter Pt nanostructures embedded in $HfO_2$) after the 50 cycles of local voltage sweeping.

The difference in the volume of oxygen vacancies leads to the varying conductive regimes examined via c-AFM. The current images show significant differences in the (dark blue) local conductive spot areas for the PtD90 device (2250±5 nm$^2$; FIG. 8E) and the TiD90 device (4600±4 nm$^2$; FIG. 8F) systems, as measured using a tip voltage of 7 V during scanning. The presence of a second, satellite conductive spot observed in the TiD90 device (580±3 nm$^2$; FIG. 8F) is expected to have resulted from one of two possible formation mechanisms: 1) multiple filaments formed due to a higher oxygen vacancy concentration; or 2) the formation of a filament network comprising multiple smaller filament branches connected to the main conducting region subsurface. A multi-branched structure likely affects the resistance level significantly, while the morphological complexity generated from each subsequent reduction cycle drives the instability observed for both the $V_{SET}$ and ON/OFF ratio.

Figure 9A:
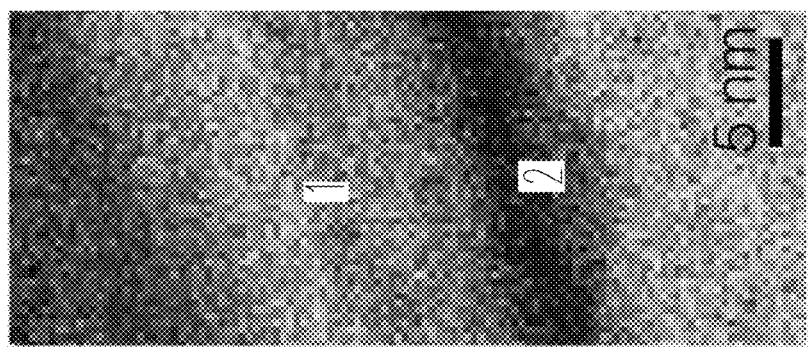
FIG. 9A is a cross-sectional high-resolution transmission electron microscopy (HRTEM) micrograph of the first Pt-embedded device of FIG. 7A (90 nm diameter Pt nanostructures embedded at the middle thickness of a $HfO_2$ structure).
Figure 9B:
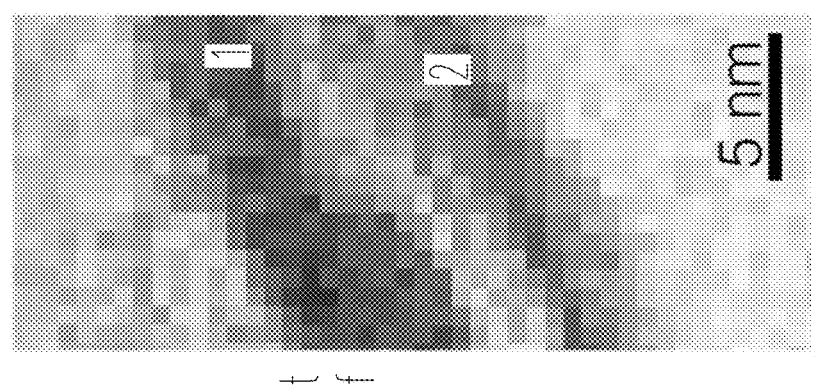
FIG. 9B is a HRTEM micrograph of the first Ti-embedded device of FIG. 7D (90 nm diameter Ti nanostructures embedded at the middle thickness of a $HfO_2$ structure).

To investigate possible contributions of network oxygen within the hafnia matrix surrounding the metal nanoislands in producing the different EFM and c-AFM responses observed in FIGS. 8C-8F cross-sectional high-resolution transmission electron microscopy (HRTEM) micrographs and scanning transmission electron microscopy-energy dispersive x-ray spectroscopy (STEM-EDS) elemental maps were collected of the m-PtD90 device and the m-TiD90 device. The HRTEM micrographs shown in FIGS. 9A and 9B confirmed that the labeled HfO$_2$ layers (5 nm; top and bottom) embedded with discontinuous Pt (FIG. 9A) or Ti (FIG. 9B) band-like nanostructures (about 3 nm) all matched the thicknesses predicted by the ALD and evaporation deposition parameters, respectively. The inventors contend that the observed discontinuous band-like structures can be attributed to multiple overlapping nanoislands positioned within the electron-beam direction of the cross-sectional transmission electron microscopy (TEM) specimen.

Figure 9C:
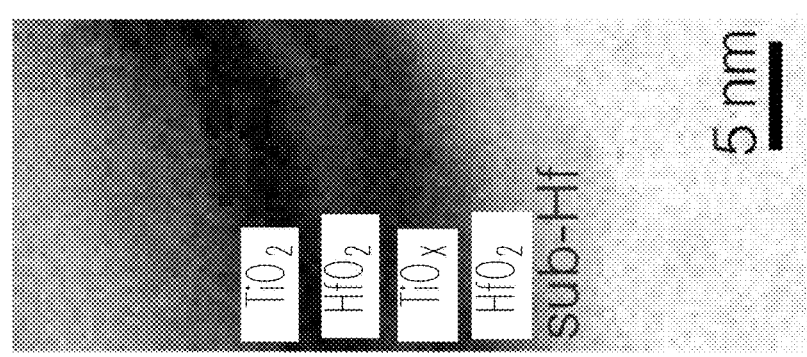
FIG. 9C is a color-coded scanning transmission electron microscopy-energy dispersive x-ray spectroscopy (STEM-EDS) elemental map of the first Pt-embedded device of FIGS. 7A and 9A (90 nm diameter Pt nanostructures embedded at the middle thickness of a $HfO_2$ structure).
Figure 9D:
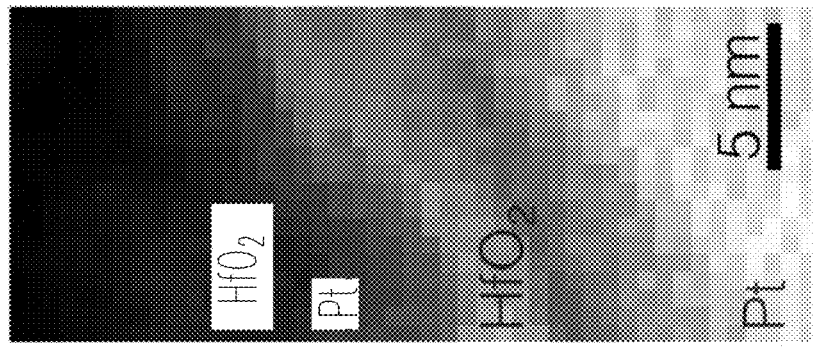
FIG. 9D is a color-coded STEM-EDS elemental map of the first Ti-embedded device of FIGS. 7D and 9B (90 nm diameter Ti nanostructures embedded at the middle thickness of a $HfO_2$ structure).
Figure 10A:
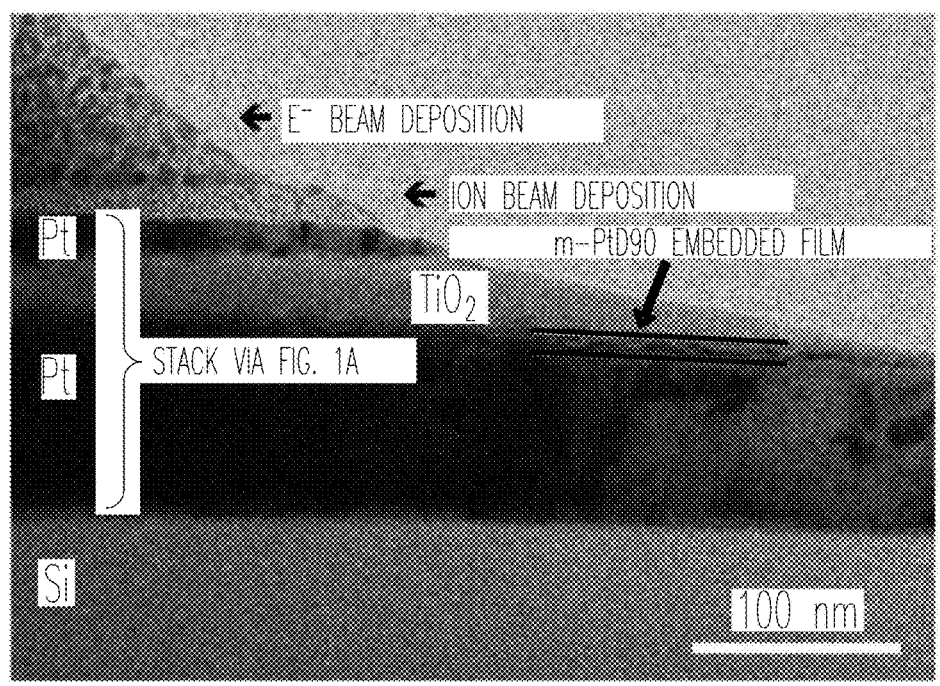
FIG. 10A is a low-resolution cross-sectional transmission electron microscopy (TEM) micrograph of the first Pt-embedded device of FIGS. 7A, 9A, and 9C (90 nm diameter Pt nanostructures embedded at the middle thickness of a $HfO_2$ structure).
Figure 10B:
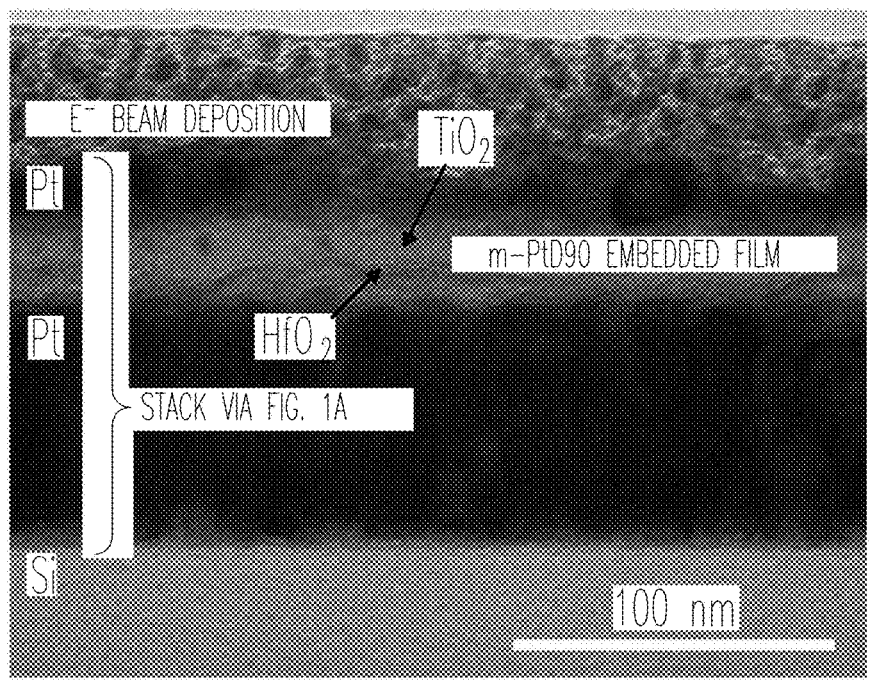
FIG. 10B is a low-resolution cross-sectional transmission electron microscopy (TEM) micrograph of the first Ti-embedded device of FIGS. 7D, 9B, and 9D (90 nm diameter Ti nanostructures embedded at the middle thickness of a $HfO_2$ structure).

FIGS. 9C and 9D are color-coded STEM-EDS elemental maps where yellow represents platinum, blue represents hafnium, green represents titanium, and red represents oxygen. FIG. 9C is a STEM-EDS elemental map of the m-PtD90 device while FIG. 9D is a STEM-EDS elemental map of the m-TiD90 device. FIGS. 9C and 9D reveal the disparate interactions of the m-PtD90 and m-TiD90 embedded nanoislands with the surrounding HfO$_2$ film matrix. The m-PtD90 device (FIG. 9C) displays a Pt band centered within a rather uniform HfO$_2$ film. In the m-TiD90 device (FIG. 9D), the lateral distribution of oxygen along the nanoisland-matrix interface indicates that no isolated metallic Ti is present in the mapped portion of the m-TiD90 device but instead is present as titanium oxides (TiO$_x$), thus providing further evidence of oxygen scavenging by the embedded Ti nanostructures. In both devices, the Ti top electrode seems to have oxidized after the FIB-assisted cross-sectional sample preparation and exposure to atmosphere, as indicated by the signal in the upper left corner of FIGS. 9C and 9D. This is also shown in FIGS. 10A and 10B, which are low-magnification transmission electron microscopy (TEM) images of the m-PtD90 device and the m-TiD90 devices, respectively.

Quantitative analysis of the elemental distribution across the heterostructures was performed by fitting the energy dispersive x-ray spectroscopy (EDS) peak intensities at each pixel of the spectrum image to determine the oxygen deficiency within the $HfO_2$ thin film layers. Recent studies of double barrier memristors suggested that the surface roughness superimposes the various layers along the beam direction, resulting in signal mixing that render stoichiometric estimates inaccurate. Table 3 shows data of the count and estimated composition of oxygen in the upper oxide layer (e.g., the second oxide layer deposited in Step 22 of the process in FIG. 1A and the region labeled "1" in FIGS. 9C and 9D) and in the lower oxide layer (e.g., the first oxide layer deposited in Step 14 of the process in FIG. 1A and the region labeled "2" in FIGS. 9C and 9D), as determined by the quantitative elemental analysis of the STEM-EDS maps of the m-PtD90 device and the m-TiD90 device).

TABLE 3

The counts and estimated composition of oxygen in the upper oxide layer ("1" FIGS. 9C and 9D) and lower oxide layer ("2" FIGS. 9C and 9D).

| Embedded system | Element | Shell | Counts | Composition (at %) |
|---|---|---|---|---|
| m-PtD90, layer "1" | O | K | 261.2 ± 2.9 | 57.6 |
| m-PtD90, layer "2" | O | K | 117.4 ± 2.9 | 23.7 |
| m-TiD90, layer "1" | O | K | 38.1 ± 3.2 | 37.0 |
| m-TiD90, layer "2" | O | K | 23.7 ± 2.9 | 6.6 |

The ratio of the oxygen signal in the upper oxide layer relative to the oxygen signal in the lower oxide layer was determined using the values from Table 3. This ratio confirmed an oxygen deficiency in the lower $HfO_2$ film within the m-PtD90 device (about 59% less in the lower $HfO_2$ layer compared to the upper $HfO_2$ layer) and within the m-TiD90 device (about 81% less in the lower $HfO_2$ layer compared to the upper $HfO_2$ layer).

The inventors posit that in both cases, the origin likely stems partially from local, growth-induced disorder of the underlying hafnia layer (e.g., during Step 14 in the process of FIG. 1A) upon highly energetic e-beam evaporation (during Step 18 in the process of FIG. 1A). Due to its high affinity with oxygen, the deposition of the titanium nanostructures in the middle of the m-TiD90 device introduces an additional contribution due to scavenging, specifically from the Ti interacting with the lower hafnia layer (e.g., via the reaction of $Ti+HfO_2 \rightarrow TiO_2+Hf$). The m-TiD90 device displays such strong scavenging behavior, a Hf-rich sublayer nearly devoid of oxygen is observed within the lower $HfO_2$ layer in the STEM-EDS map shown in FIG. 9D (e.g., the blue layer in FIG. 9D). The TEM and STEM-EDS results thus seem to confirm the greater degree of reduction surrounding the Ti nanoislands of the m-TiD90 device, which yields the more complex filament geometry displayed in FIG. 15B (described in more detail below) under the locally concentrated electric fields upon bias.

Nanoisland-embedded memristors of all metal types were found to exhibit strongly enhanced switching uniformity while the apparent change in local oxygen vacancy concentration surrounding various metal nanoislands suggest different filament morphologies may result depending on the material of the metal nanoislands. As conductive filaments dictate both the location and mechanism of transport, and ultimately enable information storage and multi-functionality, obtaining spatially-resolved information involving their construction is helpful to maximize the enhancements in performance of the process of the present disclosure and the devices that result therefrom.

Figure 11:
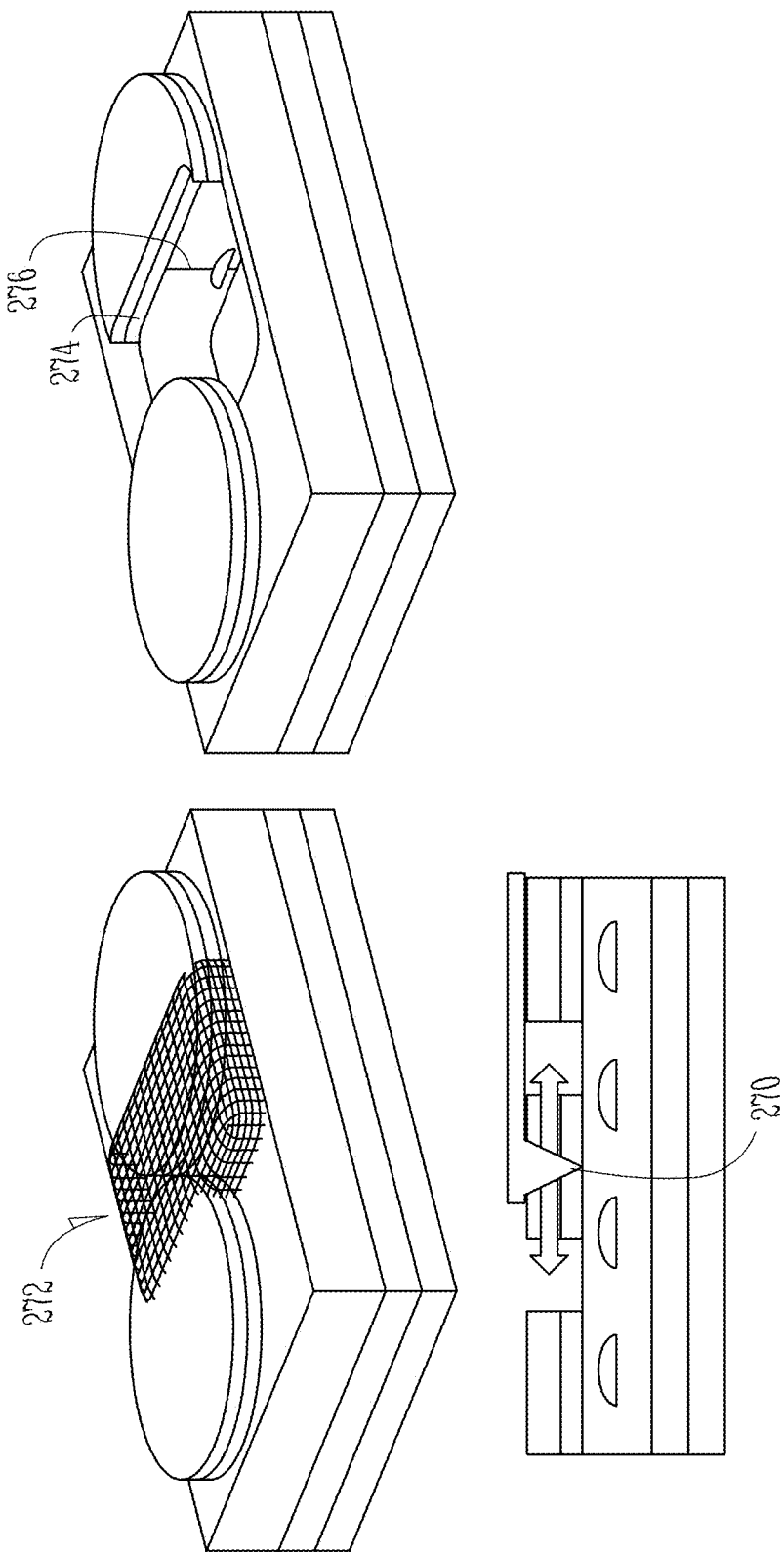
FIG. 11 is a schematic illustration of a 3D conductive atomic force microscopy (3D c-AFM) tomography process for analyzing filament morphologies in metal nanostructure embedded devices.

Three-dimensional conductive-AFM (3D c-AFM) tomography, a recently developed AFM approach, combines the sensitive force control in the z-dimension of the AFM with a hard, conductive diamond probe to sequentially remove material layer-by-layer and subsequently measure the local current, thus yielding a slice-and-view approach to observe conductive filaments within oxide-based memristors. A series of high resolution two-dimensional c-AFM images displays the evolution of local current spots corresponding to the presence of conductive filaments along the film thickness direction, thus enabling detailed analysis of the underlying switching behavior. In order to probe how nanoislands dictate the three-dimensional filament morphology and reduce variability, 3D c-AFM tomography was used to observe filament formation. FIG. 11 is a schematic illustration of this 3D tomography approach. Each device is first subjected to 50 cycles and left with the LRS induced prior to any sample removal or measurement (FIG. 11; top left). A doped diamond c-AFM probe 270 (shown schematically in FIG. 11) served as the nanoscalpel, which executed two separate sweeps operated in contact mode. The first sweep removed material from the region 272 being examined. The second sweep performed the conductive measurement (FIG. 11; bottom). Removing a portion of the electrode 274 exposed the conducting filament 276 on the film surface underneath, the locations of which were magnified for subsequent scanning (FIG. 11, top right).

Figure 12:
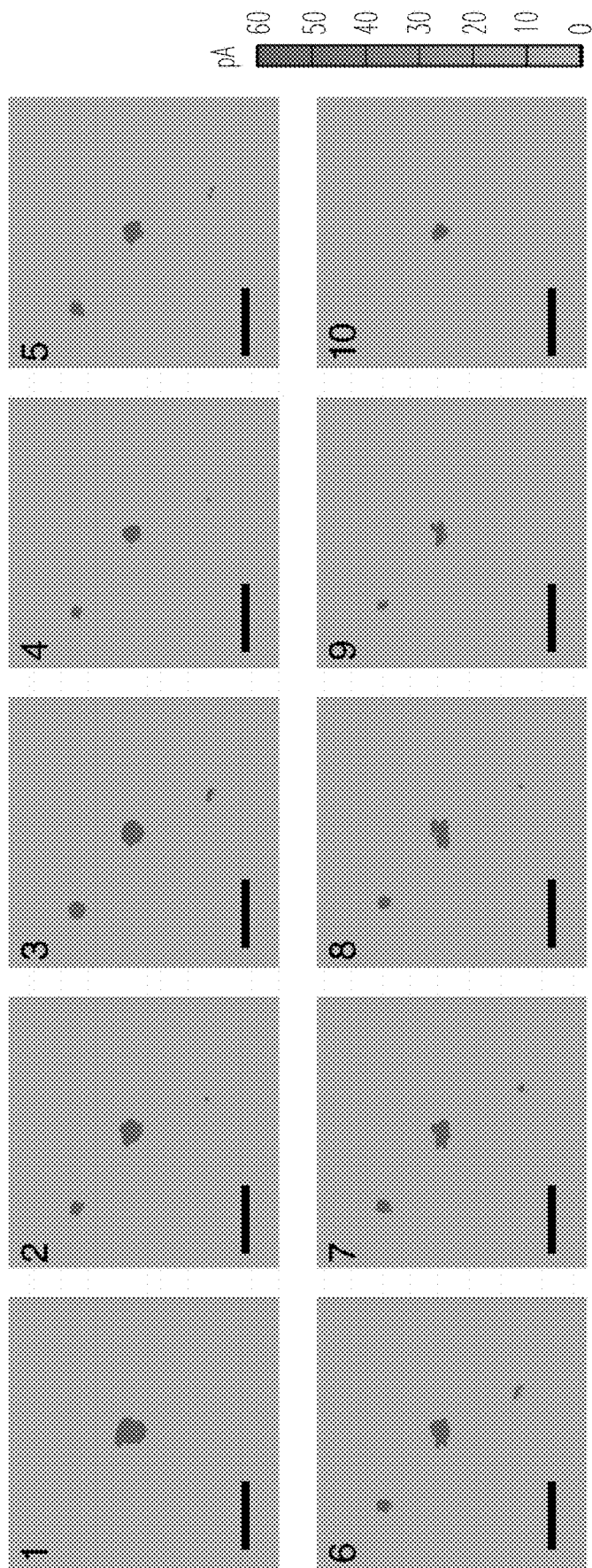
FIG. 12 is series of current map images of the second Pt-embedded device of FIG. 7A (90 nm diameter Pt nanostructures embedded near a bottom of a $HfO_2$ structure) taken using the 3D c-AFM tomography process of FIG. 11, with 10 representative images out of the 30 images captured being shown.
Figure 13A:
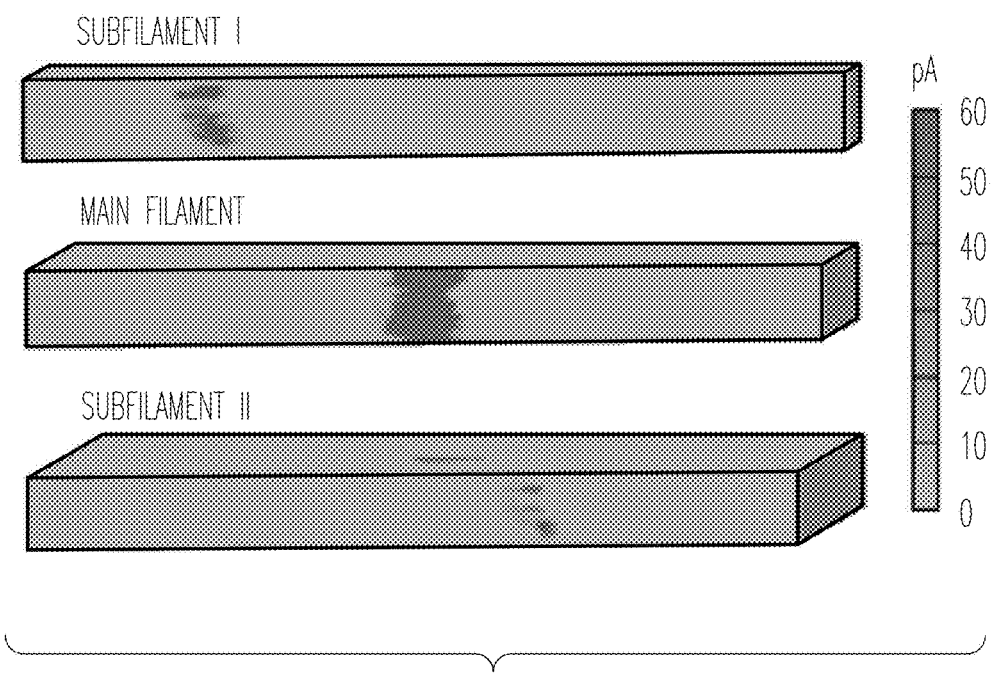
FIG. 13A is cross-sectional observation of the filamentary geometry inside the second Pt-embedded device of FIG. 7A (90 nm diameter Pt nanostructures embedded near a bottom of a $HfO_2$ structure), which was generated using the map images represented in FIG. 12.

A series of 2D current images were collected of the PtD90 device (Images 1-10 in FIG. 12) to produce a sequence of 3D side view conductive map of the PtD90 device (FIG. 13A). In this example of the PtD90 device, one larger "main" filament was observed that spans substantially the entire film thickness from top to bottom (FIG. 13A; middle) flanked by two smaller, fragmented conductive channels or subfilaments (FIG. 13A; top and bottom) that terminate within the $HfO_2$ film. The main filament produces the strongest current, dominating the electrical behavior during the switching process. The main filament possessed an average diameter of 10, 15, and 20 nm, respectively, as measured at different slices along the film thickness direction of the cross-sectional profile (FIG. 13A; middle). A combination of an hourglass-like and conical-shaped main conductive channel morphology was observed (FIG. 9D), with an area ranging from $390±2$ $nm^2$ to $110±2$ $nm^2$ and variations in the corresponding cross-sectional diameter from 20±1 nm to 10±0.5 nm. The coexistence of one main and several secondary subfilaments observed fully supports recent photoelectron emission studies of oxide thin films that showed subfilamentary formation caused cycle-to-cycle variability due to thermally-assisted recombination of oxygen vacancies.

Figure 13B:
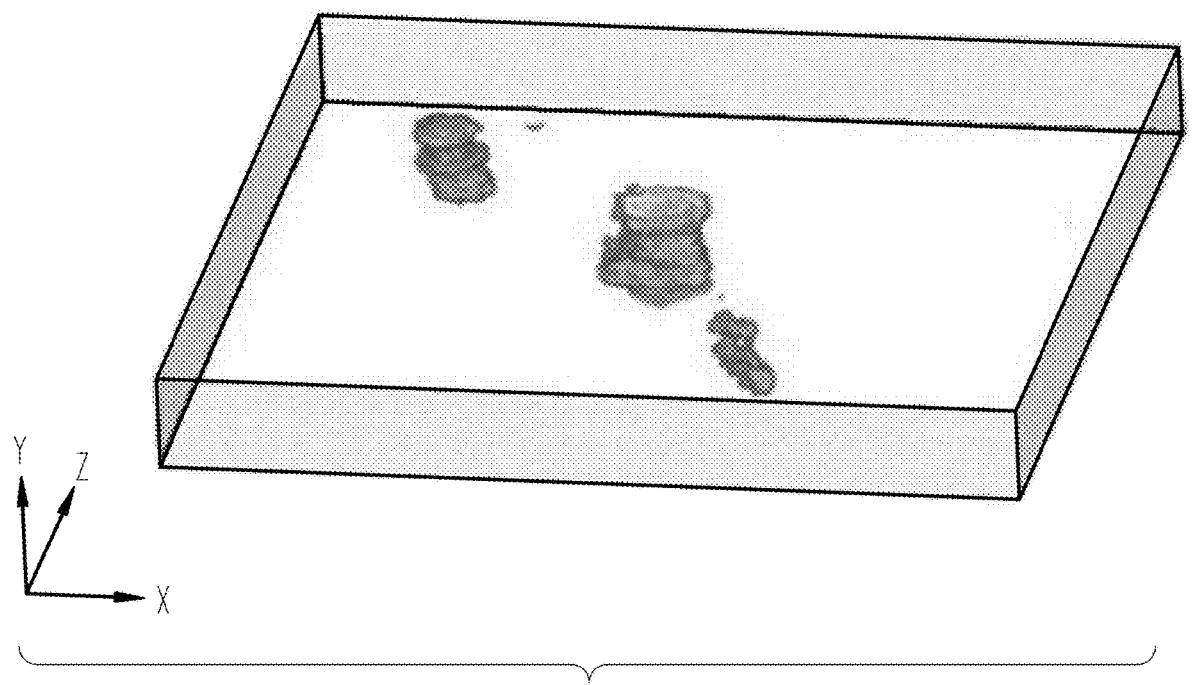
FIG. 13B is a representation of the three-dimensional structure of the conductive filaments in the second Pt-embedded device of FIGS. 7A and 13A (90 nm diameter Pt nanostructures embedded near a bottom of a $HfO_2$ structure).
Figure 13C:
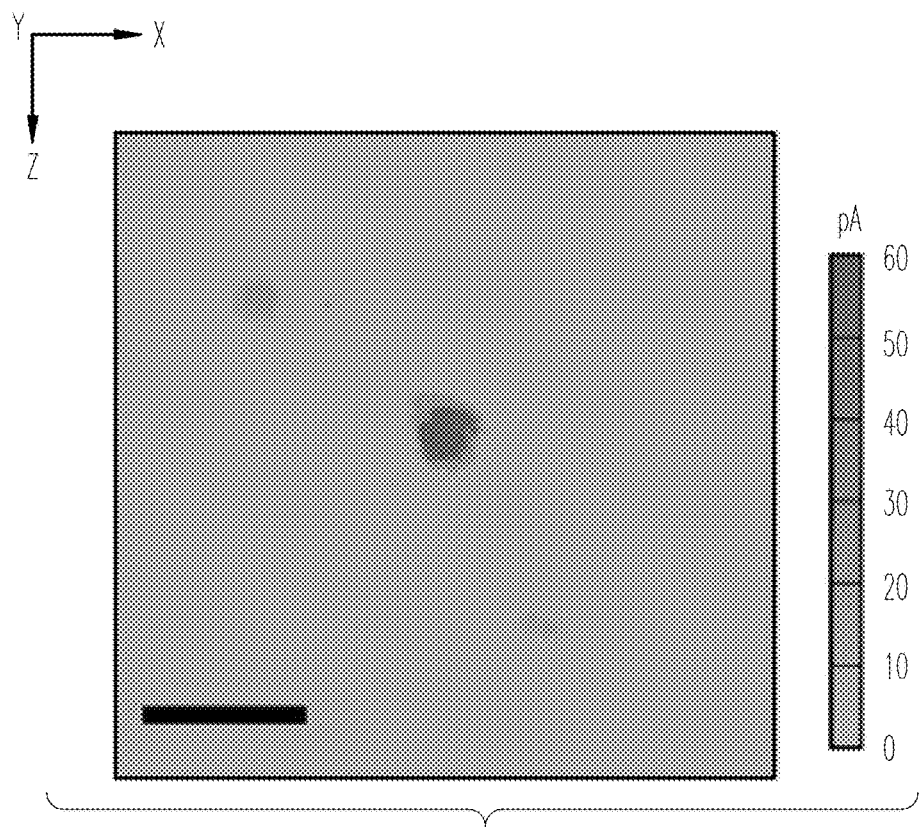
FIG. 13C is a top view of the three-dimensional structure of the conductive filaments in the second Pt-embedded device of FIGS. 7A and 13A (90 nm diameter Pt nanostructures embedded near a bottom of a $HfO_2$ structure) via a computer-generated current volume viewer.
Figure 13D:
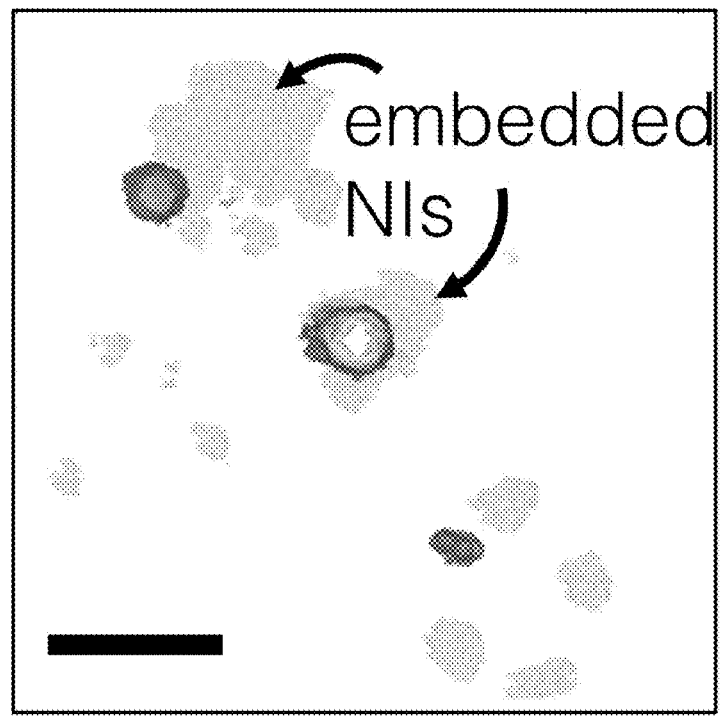
FIG. 13D is a top view of the three-dimensional structure of the conductive filaments in the second Pt-embedded device of FIGS. 7A and 13A (90 nm diameter Pt nanostructures embedded near a bottom of a $HfO_2$ structure) with the location of the embedded Pt nanostructures being shaded to show the relationship between the nanostructures and the filaments.

A transparent 3D current image of the PtD90 device is shown in FIG. 13B, which highlights the position of the main filament (blue, middle) and subfilaments (blue, upper left, lower right) relative to the embedded Pt-D90 nanoisland array (grey). Removing the $HfO_2$ thin film layer-by-layer along the thickness-direction of the entire device enabled the direct observation of the embedded nanoislands (grey areas) close to the bottom electrode, with the resulting filaments also visible along the nanoisland periphery. Note the filament growth follows along the outermost edge of the embedded nanoislands where the highest electric field occurs. The majority of the current flow is confined to the main conductive filament after SET operation, as evident by the highest current values observed within the largest filament in FIG. 13C. As the dominant filament ruptures during the RESET process, each subfilament effectively competes to become the active, primary conductive pathway for the next cycle. The presence of multiple filaments thus controls the switching behavior, inducing undesired parameter fluctuation and device failure. FIGS. 13B and 13D demonstrate the ability of 3D c-AFM nanotomography to directly observe the overall shape, morphology, spatial position, and strength for complete filament characterization.

Figure 14:
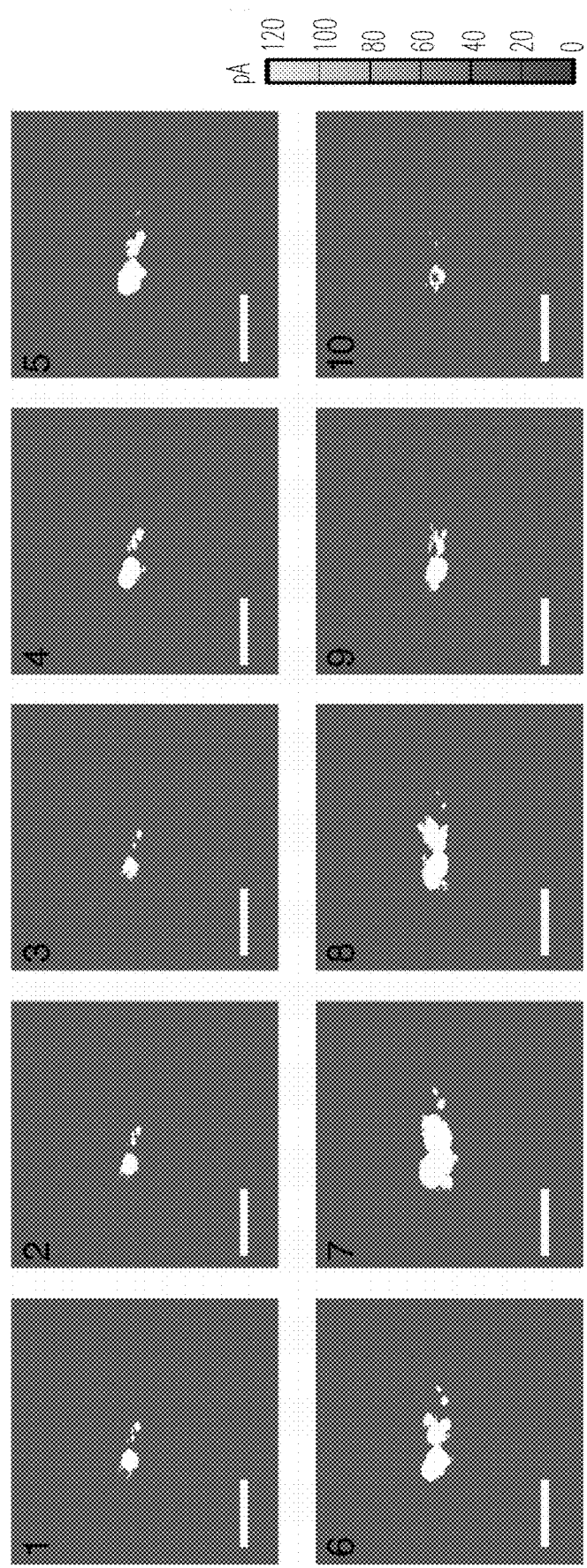
FIG. 14 is series of current map images of the second Ti-embedded device of FIG. 7D (90 nm diameter Ti nanostructures embedded near a bottom of a $HfO_2$ structure) taken using the 3D c-AFM tomography process of FIG. 11, with 10 representative images out of the 30 images captured being shown.

A similar method was used to characterize the TiD90 device. For example, a series of 2D current images were collected of the TiD90 device (Images 1-10 in FIG. 14) to produce a sequence of 3D side view conductive map of the TiD90 device (FIG. 15A) and to produce a 3D reconstruction of the device (FIG. 15B). Compared to the subfilamentary formation observed in the embedded Pt-D90 device, the filament morphology generated by the embedded Ti-D90 nanoisland array exhibits significantly different features, such as the enlarged area observed in the 2D current image (FIGS. 14 and 15A) and the stochastic geometry found in the 3D reconstruction (FIG. 15B). In contrast to the Pt-D90 system, the Ti-D90 system displays three separate, individual conductive pathways originating at the surface (with diameters ranging from 10±2 nm to 80±5 nm) that eventually merge to become one large, primary filament (area=1460±5 $nm^2$), as shown in the 3D side view current image projection in FIG. 15C. These results are consistent with the EFM phase image (FIG. 8D) and current image (FIG. 8F) of the embedded Ti-D90, which further supports an increase in the local oxygen vacancy concentration due to the Ti scavenging oxygen from the surrounding film, thus creating the complex, branched network-like morphology of the conducting channel.

Figure 15A:
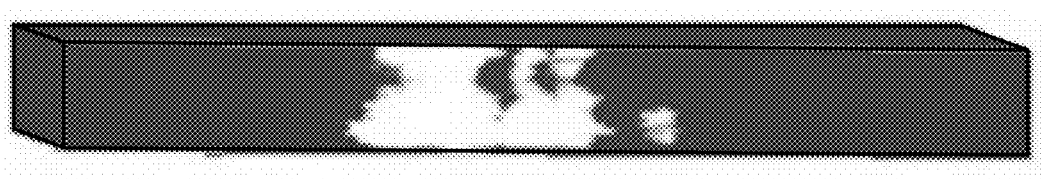
FIG. 15A is cross-sectional observation of the filamentary geometry inside the second Ti-embedded device of FIG. 7D (90 nm diameter Ti nanostructures embedded near a bottom of a $HfO_2$ structure), which was generated using the map images represented in FIG. 14.
Figure 15B:
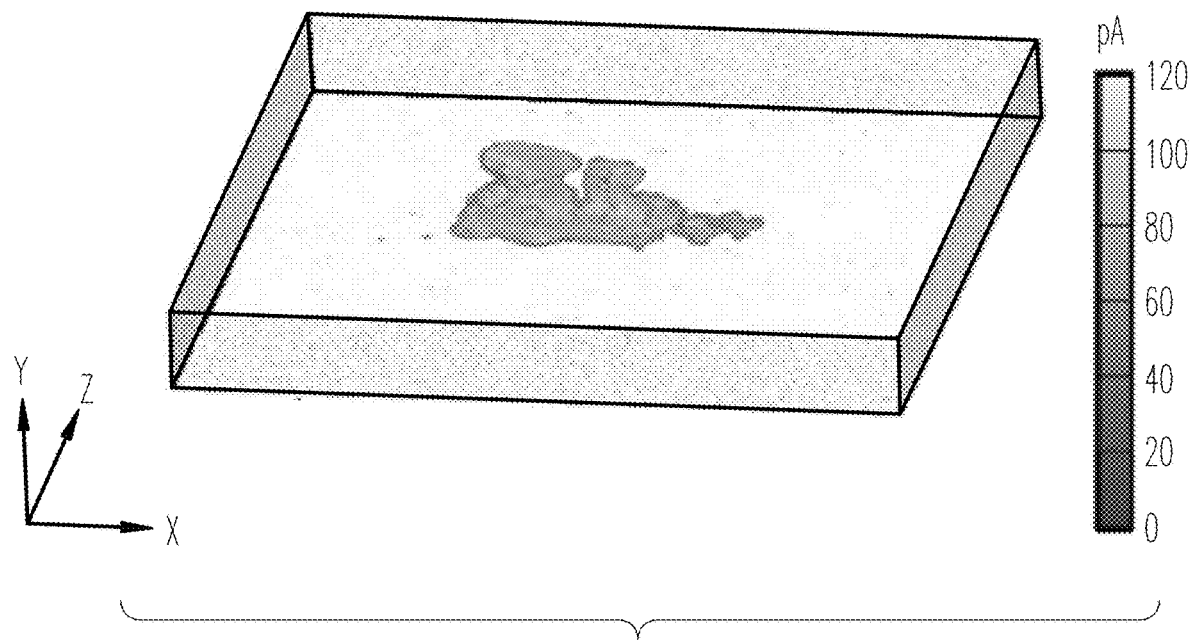
FIG. 15B is a representation of the three-dimensional structure of the conductive filaments in the second Ti-embedded device of FIGS. 7D and 15A (90 nm diameter Ti nanostructures embedded near a bottom of a $HfO_2$ structure).
Figure 15C:
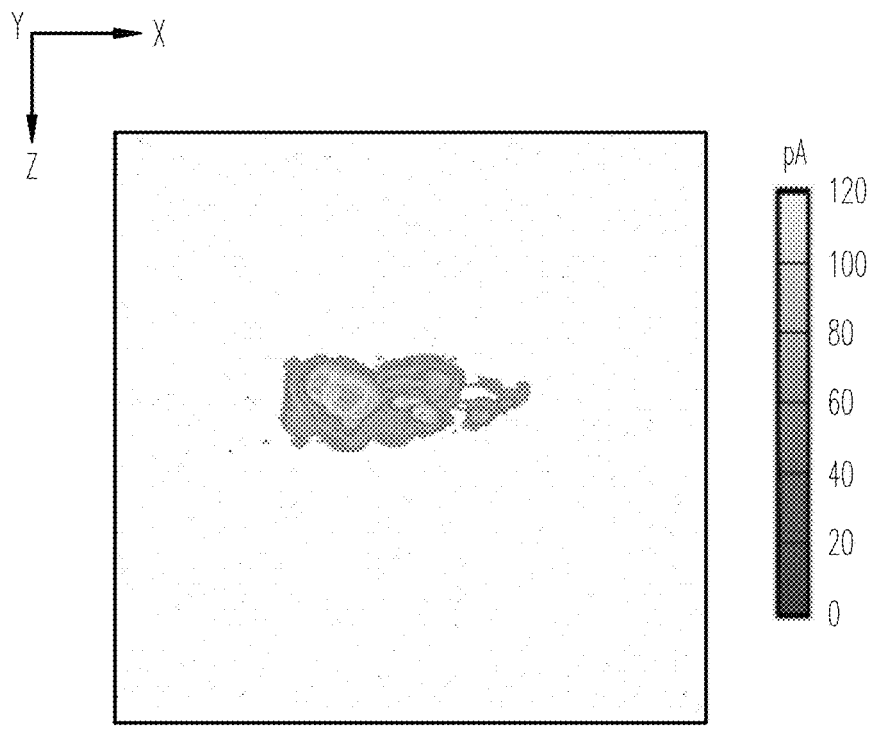
FIG. 15C is a top view of the three-dimensional structure of the conductive filaments in the second Ti-embedded device of FIGS. 7D and 15A (90 nm diameter Ti nanostructures embedded near a bottom of a $HfO_2$ structure).
Figure 16:
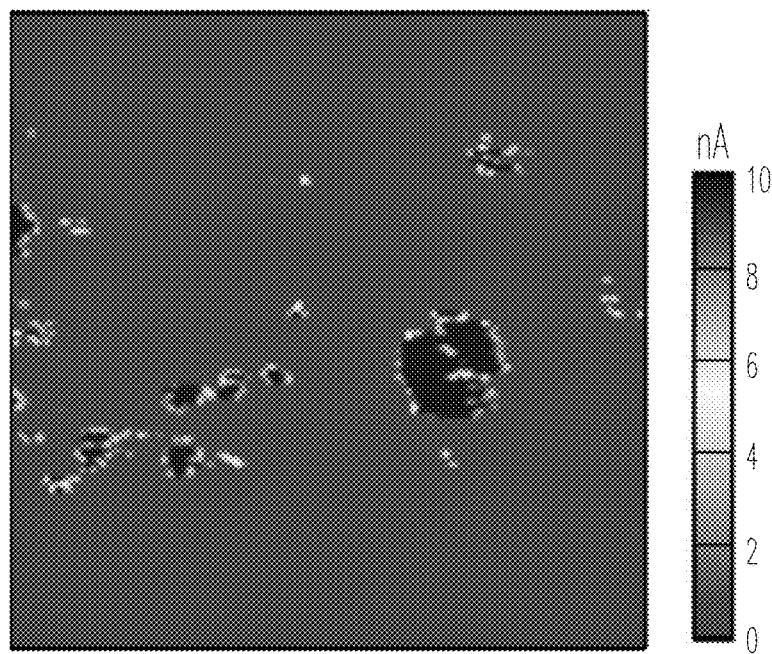
FIG. 16 is a conductive atomic force microscopy (c-AFM) image of the bare (e.g., not embedded with nanostructures) $HfO_2$ control device.

The c-AFM nanotomography results described above identified two separate filamentary morphologies; the existence of one large, primary filament surrounded by additional subfilamentary conductive paths in the Pt-D90 system (FIGS. 13A-13D), and the growth of a multi-branched conductive network in the Ti-D90 system (FIG. 15A-15C). The large, stochastic nature of the branched filament network likely contributes to the severe degradation of the resistance states observed for the Ti-D90 device. Removing the top electrode of the bare $HfO_2$ thin film reference sample revealed multiple conducting spots (as shown in FIG. 16) attributed to the random migration and redistribution of oxygen vacancies that drive the unexpected formation of smaller, secondary channels that ultimately increase the number of competitive pathways during the reformation process. The inventors propose that these results suggest that the design of embedded thin films should take advantage of the electrochemical stability of the nanoislands within its surround matrix. The inventors further conclude that inert nanoislands clearly simplify the morphological complexity of the conducting channel, thus reducing both the operating parameters and the cycle-to-cycle variability.

In summary, the process of the present disclosure is able to embed hierarchically-ordered metallic nanoislands within oxide films, such as memristive $HfO_2$ thin films, to overcome the random size and spatial distribution limitations of prior embedded nanostructured approaches to enhance switching performance and observe conductive filament dynamics. Thin films embedded with Pt, Ti, and Ag of two distinct diameter regimes demonstrated significant reductions in both operating voltage and resistance, while also yielding enhanced cycle-to-cycle uniformity. Further improvements to $V_{SET}$ were made possible by translating the embedded nanoisland arrays from the middle of the film towards the bottom electrode. The concentrated electric fields promoted oxygen vacancy generation and accumulation, as shown by the evolution of EFM phase and c-AFM current images between Pt and reactive Ti nanoislands, whose scavenging behavior was confirmed via STEM-EDS analysis. Use of the slice-and-view 3D c-AFM nanotomography confirmed the subsequent morphological differences of conductive filaments produced with Pt and Ti nanoislands. The electrochemical stability of Pt nanoislands yielded multiple, hourglass-shaped filaments found along the nanoisland periphery where the maximum local electric field enhancement occurs. A large branched filamentary network within the Ti-embedded film, resulting from the high vacancy concentrations induced as Ti extracts oxygen from the surrounding oxide matrix. Overall the versatility of template-directed deposition of embedded nanostructures should be extendable to include other, non-metallic material systems such as functional complex oxides, thus opening a wealth of opportunities to study transport, ferroic, and physiochemical phenomena sensitive to large electric fields.

EXPERIMENTAL METHODS

The following methods were used for the experimental procedures described above.

Embedded Thin Film Preparation

In order to prepare the device, a 5 nm Ti adhesion layer and 30 nm Pt bottom electrode was deposited by evaporator sequentially on a $SiO_2$/Si substrate (University Wafer). A $HfO_2$ oxide layer was grown to a thickness of 5 nm or 1 nm by atomic layer deposition (ALD) at 250° C. with tetrakis (dimethylamino)hafnium and $H_2O$ as a Hf precursor and oxygen source, respectively. The ultrathin AAO template (TopMembranes Inc., Shenzhen, China) was transferred onto the $HfO_2$ layer with two different pore sizes (30 and 90 nm), followed by the deposition of a 3.5 nm metal (Ti, Pt, Ag) thin film using e-beam evaporation. After removing the template, a second $HfO_2$ layer was deposited via ALD to a thickness of 5 nm using the same conditions as the first layer. Finally, a 30 nm thick Ti top electrode and 15 nm thick Pt capping layer with a 50 μm diameter were deposited to complete the memristive device. A bare Ti/$HfO_2$ (10 nm)/Pt structure with no embedded nanostructures was prepared for reference (control) purposes.

Local Probe and Bulk Electrical Characterization

The topography was characterized by atomic force microscopy (AFM; CypherES™, Oxford Instruments/Asylum Research, Goleta, Calif.) and scanning electron microscopy (SEM; JSM-7001FE). Electrostatic force microscopy (EFM) and conductive atomic force microscopy (c-AFM) were performed using conductive Pt/Ir coated tips (Asylum Research, ASYELEC.01-R2) at a scan rate of 1.6 Hz. The electrical properties were measured with a two-probe method by Keithley 4200 semiconductor characterization system in DC sweeping mode on a probe station (Wentworth MP-2300). The area of the conducting regime in EFM and c-AFM images were analyzed by the volume viewer within ImageJ image processing software.

Transmission Electron Microscopy (TEM)

Cross-sectional TEM specimens were prepared by FIB lift-out methods using a Tescan GAIA3 SEM-FIB system. TEM imaging was performed on a JEOL JEM-2100F operated at 200 kV. STEM EDS experiments were carried out on a JEOL JEM-ARM300F equipped with dual silicon drift EDS detectors, and the microscope was operated at 300 kV. The dwell time was 0.5 s/pixel for acquisition of EDS spectrum images.

Three-Dimensional Conductive Atomic Force Microscopy Nanotomography

To locate the position of the conductive filament, the diameter of the top electrode was reduced to 1 μm, as patterned by electron beam lithography. Before scanning, I-V responses were collected and the devices were cycled and left in the LRS. A doped-diamond conductive tip (DDESP-V2, Bruker) with a spring constant of 80 N/m was used as both a nanoscalpel and the current detecting probe. The removal rate strongly depends on the material type and the fabrication conditions and is adjusted by changes in the scan velocity and contact force.55 The contact force is also important as it is known to strongly influence point-mode spectroscopic I-V measurements.56 A small scan rate of 0.3 Hz was used to ensure a uniform removal region while a small set point (0.1-0.5V) was applied for removing the electrode material, yielding an average removal rate of 10 nm/scan. After removing the electrode, the oxide layer was entirely exposed such that the filaments were observed as multiple conductive spots and magnified to obtain high lateral resolution. The removal rate then has been reduced to about 0.5 nm/scan, leading to large number of 2D slices containing current information. The probe apex becomes slightly blunt after electrode removal. Reconstruction of the consecutive current images was performed using a volume viewer plugin in ImageJ utilizing 1D or 2D transfer functions.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
depositing a first oxide material onto a first electrode to form a first oxide layer comprising a first oxide bottom surface in contact with the first electrode and an opposing first oxide top surface;
positioning an anodic aluminum oxide template at a specified position on the first oxide top surface, the anodic aluminum oxide template comprising an anodic aluminum oxide body with a bottom template face that contacts the first oxide top surface and an opposing top template face, wherein the anodic aluminum oxide body defines a plurality of nanopores that extend through the body from the top template face to the bottom template face;
depositing a nanostructure material comprising at least one of a metal, a metal oxide, a carbide, a nitride, an elemental semiconductor, or a compound semiconductor into at least a portion of the plurality of the nanopores and in contact with the first oxide top surface to form a plurality of solid nanostructures on the first oxide top surface, wherein each of the plurality of solid nanostructures are formed in a corresponding one of the plurality of nanopores of the anodic aluminum oxide template;
separating the anodic aluminum oxide template from the first oxide layer and the plurality of solid metal nanostructures;
depositing a second oxide material onto the first oxide top surface and the plurality of solid nanostructures to form a second oxide layer comprising a second oxide bottom surface in contact with the first oxide top surface and the plurality of solid nanostructures and an opposing second oxide top surface; and forming a second electrode in electrical contact with at least a portion of the second oxide top surface.

2. A method according to claim 1, wherein the second oxide material is the same as the first oxide material.

3. A method according to claim 1, wherein the second oxide material is different from the first oxide material.

4. A method according to claim 1, wherein the step of depositing the nanostructure material into at least the portion of the plurality of the nanopores comprises depositing a single metal, metal oxide, carbide, nitride, elemental semiconductor, or compound semiconductor into at least the portion of the plurality of nanopores.

5. A method according to claim 1, wherein the step of depositing the nanostructure material into at least the portion of the plurality of the nanopores comprises depositing a first nanostructure layer comprising at least one of a first metal, a first metal oxide, a first carbide, a first nitride, a first elemental semiconductor, or a first compound semiconductor into at least the portion of the plurality of nanopores on the first oxide top surface and depositing a second nanostructure layer comprising at least one of a second metal, a second metal oxide, a second carbide, a second nitride, a second elemental semiconductor, or a second compound semiconductor into at least the portion of the plurality of nanopores on the first nanostructure layer.

6. A method according to claim 1, wherein a ratio of a thickness of the anodic aluminum oxide template relative to a width of the nanopores is 8 or less.

7. A method according to claim 1, wherein forming the plurality of metal nanostructures comprises evaporating metal material into at least a portion of the plurality of nanopores.

8. A method according to claim 1, further comprising applying an adhesive to at least the portion of the second oxide top surface and adhering the second electrode to the portion of the second oxide top surface.

9. A method according to claim 1, wherein the second electrode comprises a bottom electrode face that is in electrical contact with the second oxide top surface and an opposing top electrode face, the method further comprising forming a capping layer on the top electrode face.

10. A method according to claim 1, wherein the step of forming the second electrode comprises patterning the second electrode on the second oxide layer.

11. A method according to claim 1, wherein the metal material that is used to form the plurality of solid metal nanostructures comprises at least one of silver ($Ag^0$) gold ($Au^0$), cobalt ($Co^0$), nickel ($Ni^0$), palladium ($Pd^0$), platinum ($Pt^0$), ruthenium ($Ru^0$), titanium ($Ti^0$), or hafnium ($Hf^0$), or other transition metals or elemental/compound semiconductors.

12. A method according to claim 1, wherein at least one of the first oxide material and the second oxide material comprises at least one of hafnium oxide ($HfO_2$), silicon oxide ($SiO_2$).

13. A method according to claim 1, wherein each of the plurality of solid metal nanostructures has a largest size in any particular direction is no more than about 1 micrometer.

14. A method according to claim 1, wherein each of the plurality of solid metal nanostructures has a largest size in any particular direction is no more than about 100 nanometers.

15. A method according to claim 1, wherein each of the plurality of solid metal nanostructures has a size in a lateral direction of from about 10 nanometers to about 150 nanometers.

16. A method according to claim 1, wherein each of the plurality of solid metal nanostructures has a size in a lateral direction of about 90 nanometers or less.

17. A method according to claim 1, wherein each of the plurality of solid metal nanostructures has a size in a lateral direction of from about 30 nanometers to about 90 nanometers.

18. A method according to claim 1, wherein the nanopores of the anodic aluminum oxide template are positioned in one or more clusters in a predefined pattern with a specified area density and a specified spacing such that the corresponding solid metal nanostructures are formed into one or more clusters having the predefined pattern with the specified area density and the specified spacing.

* * * * *

UNITED STATES PATENT AND TRADEMARK OFFICE
CERTIFICATE OF CORRECTION

PATENT NO. : 10,903,075 B2
APPLICATION NO. : 16/575195
DATED : January 26, 2021
INVENTOR(S) : Nonnenmann et al.

Page 1 of 1

It is certified that error appears in the above-identified patent and that said Letters Patent is hereby corrected as shown below:

In the Claims

In Column 28, Line 8, in Claim 11, delete "$(Ag^0)$" and insert --$(Ag^0)$,-- therefor In Column 28, Line 9, in Claim 11, delete "$(Ni^0)$ ," and insert --$(Ni^0)$,-- therefor Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*